US012203782B2

(12) United States Patent
Yamamura et al.

(10) Patent No.: US 12,203,782 B2
(45) Date of Patent: Jan. 21, 2025

(54) PROXIMITY SENSOR, CONTROL SYSTEM, AND EQUIPMENT

(71) Applicant: Panasonic Intellectual Property Management Co., Ltd., Osaka (JP)

(72) Inventors: Akihiro Yamamura, Osaka (JP); Kota Araki, Osaka (JP); Kenji Shibata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 141 days.

(21) Appl. No.: 18/246,293

(22) PCT Filed: Aug. 27, 2021

(86) PCT No.: PCT/JP2021/031537
§ 371 (c)(1),
(2) Date: Mar. 22, 2023

(87) PCT Pub. No.: WO2022/070712
PCT Pub. Date: Apr. 7, 2022

(65) Prior Publication Data
US 2023/0358572 A1    Nov. 9, 2023

(30) Foreign Application Priority Data

Oct. 1, 2020   (JP) .................................. 2020-167331

(51) Int. Cl.
*G01D 5/241*    (2006.01)
(52) U.S. Cl.
CPC .................... *G01D 5/241* (2013.01)
(58) Field of Classification Search
CPC ........... G01D 5/241; H03K 2017/9455; H03K 2017/9602; H03K 2217/960765;
(Continued)

(56) References Cited

U.S. PATENT DOCUMENTS

| 5,363,051 A | 11/1994 | Jenstrom et al. |
| 2005/0264304 A1 | 12/2005 | Nakamura et al. |

(Continued)

FOREIGN PATENT DOCUMENTS

| JP | 2005-327636 A | 11/2005 |
| WO | 2010/053013 A1 | 5/2010 |

(Continued)

OTHER PUBLICATIONS

International Search Report dated Oct. 26, 2021 issued in International Patent Application No. PCT/JP2021/031537, with English translation.

*Primary Examiner* — Jermele M Hollington
*Assistant Examiner* — Zannatul Ferdous
(74) *Attorney, Agent, or Firm* — Rimon P.C.

(57) ABSTRACT

A proximity sensor includes a conductor, a receiving electrode, and a first transmission electrode. The conductor has an upper surface. The receiving electrode is separate from the upper surface of the conductor in an upward direction and extends along a first direction. The first direction is orthogonal to the upward direction. The first transmission electrode is separate from the upper surface of the conductor in the upward direction and extends along the first direction. The first transmission electrode and the receiving electrode are aligned with each other in a second direction. The second direction is orthogonal to both the upward direction and the first direction. The first transmission electrode has an upper surface having a shape bulging in the upward direction in a cross section orthogonal to the first direction.

20 Claims, 18 Drawing Sheets

(58) Field of Classification Search
CPC ........ H03K 17/955; G01B 7/00; G01B 7/044; G01B 7/023; H01H 36/00
See application file for complete search history.

(56) References Cited

U.S. PATENT DOCUMENTS

| | | | |
|---|---|---|---|
| 2014/0176160 A1* | 6/2014 | Erkens ................. | H03K 17/955 324/658 |
| 2014/0239981 A1* | 8/2014 | Zibold .................... | G01V 3/15 324/680 |
| 2016/0245671 A1* | 8/2016 | Wuerstlein ........... | G01N 27/221 |
| 2019/0248020 A1 | 8/2019 | Yoon et al. | |
| 2019/0272063 A1* | 9/2019 | Niwa .................... | G06F 3/0446 |

FOREIGN PATENT DOCUMENTS

| | | |
|---|---|---|
| WO | 2015/093006 A1 | 6/2015 |
| WO | 2018/079771 A1 | 5/2018 |

* cited by examiner

PROXIMITY SENSOR, CONTROL SYSTEM, AND EQUIPMENT

CROSS-REFERENCE OF RELATED APPLICATIONS

This application is the U.S. National Phase under 35 U.S.C. § 371 of International Patent Application No. PCT/JP2021/031537, filed on Aug. 27, 2021, which in turn claims the benefit of Japanese Patent Application No. 2020-167331, filed on Oct. 1, 2020, the entire disclosures of which Applications are incorporated by reference herein.

TECHNICAL FIELD

The present disclosure generally relates to proximity sensors, control systems, and equipment, and specifically to, a mutual capacitance proximity sensor, and a control system and equipment which include the mutual capacitance proximity sensor.

BACKGROUND ART

Patent Literature 1 describes a proximity sensor device including: a detection electrode which forms an electrostatic capacitance between the detection electrode and an object to be detected (sensing target); a base plate to which the detection electrode is fitted; and a detection section that detects the electrostatic capacitance. The base plate is supported by a push-button switch or a pressure sensor. When the object to be detected approaches the detection electrode, the electrostatic capacitance changes, and based on a change in the electrostatic capacitance, approach of the object to be detected can be sensed.

In such a proximity sensor device as described in Patent Literature 1, it may be desirable to improve the detection sensitivity to a sensing target.

CITATION LIST

Patent Literature

Patent Literature 1: WO 2018/079771 A1

SUMMARY OF INVENTION

It is an object of the present disclosure to provide a proximity sensor having improved detection sensitivity to a sensing target, and a control system and equipment which include the proximity sensor.

A proximity sensor according to an aspect of the present disclosure is a mutual capacitance proximity sensor including a conductor, a receiving electrode, and a first transmission electrode. The conductor has an upper surface. The receiving electrode is separate from the upper surface of the conductor in an upward direction and extends in a first direction. The first direction is orthogonal to the upward direction. The first transmission electrode is separate from the upper surface of the conductor in the upward direction and extends along the first direction. The first transmission electrode and the receiving electrode are aligned with each other in a second direction. The second direction is orthogonal to both the upward direction and the first direction. The first transmission electrode has an upper surface having a shape bulging in the upward direction in a cross section orthogonal to the first direction.

A proximity sensor according to another aspect of the present disclosure is a mutual capacitance proximity sensor including a conductor, a receiving electrode, a first transmission electrode, and a second transmission electrode. The conductor has an upper surface. The receiving electrode is separate from the upper surface of the conductor in an upward direction and extends in a first direction. The first direction is orthogonal to the upward direction. The first transmission electrode is separate from the upper surface of the conductor in the upward direction and extends along the first direction. The second transmission electrode is separate from the upper surface of the conductor in the upward direction and extends along the first direction. The first transmission electrode is disposed on a side, with respect to the receiving electrode, in one direction of both directions parallel to a second direction. The second direction is orthogonal to both the upward direction and the first direction. The second transmission electrode is disposed on a side, with respect to the receiving electrode, in the other direction of both the directions parallel to the second direction. The upper surface of the conductor includes a first convex region, a second convex region, and a concave region. The first convex region has a shape extending along the first direction and bulging in the upward direction. The second convex region has a shape extending along the first direction and bulging in the upward direction. The concave region is provided at a location which is between an upper end of the first convex region and an upper end of the second convex region in the second direction and which is under the receiving electrode. The concave region has a shape extending in the first direction and bulging in a downward direction. The upper end of the first convex region is located between the first transmission electrode and the receiving electrode when viewed from above. The upper end of the second convex region is located between the second transmission electrode and the receiving electrode when viewed from above. The first transmission electrode has an upper surface having a shape bulging in the upward direction in a cross section orthogonal to the first direction. The second transmission electrode has an upper surface having a shape bulging in the upward direction in the cross section orthogonal to the first direction.

A control system according to an aspect of the present disclosure includes: the proximity sensor of any one of the aspects described above; and an output section. The output section is configured to output a control signal which controls equipment in accordance with an output from the proximity sensor.

Equipment according to an aspect of the present disclosure includes: the proximity sensor of any one of the aspects described above; and a functional unit. The functional unit is configured to operate in accordance with an output from the proximity sensor.

DESCRIPTION OF EMBODIMENTS

Embodiment

Figure 1:
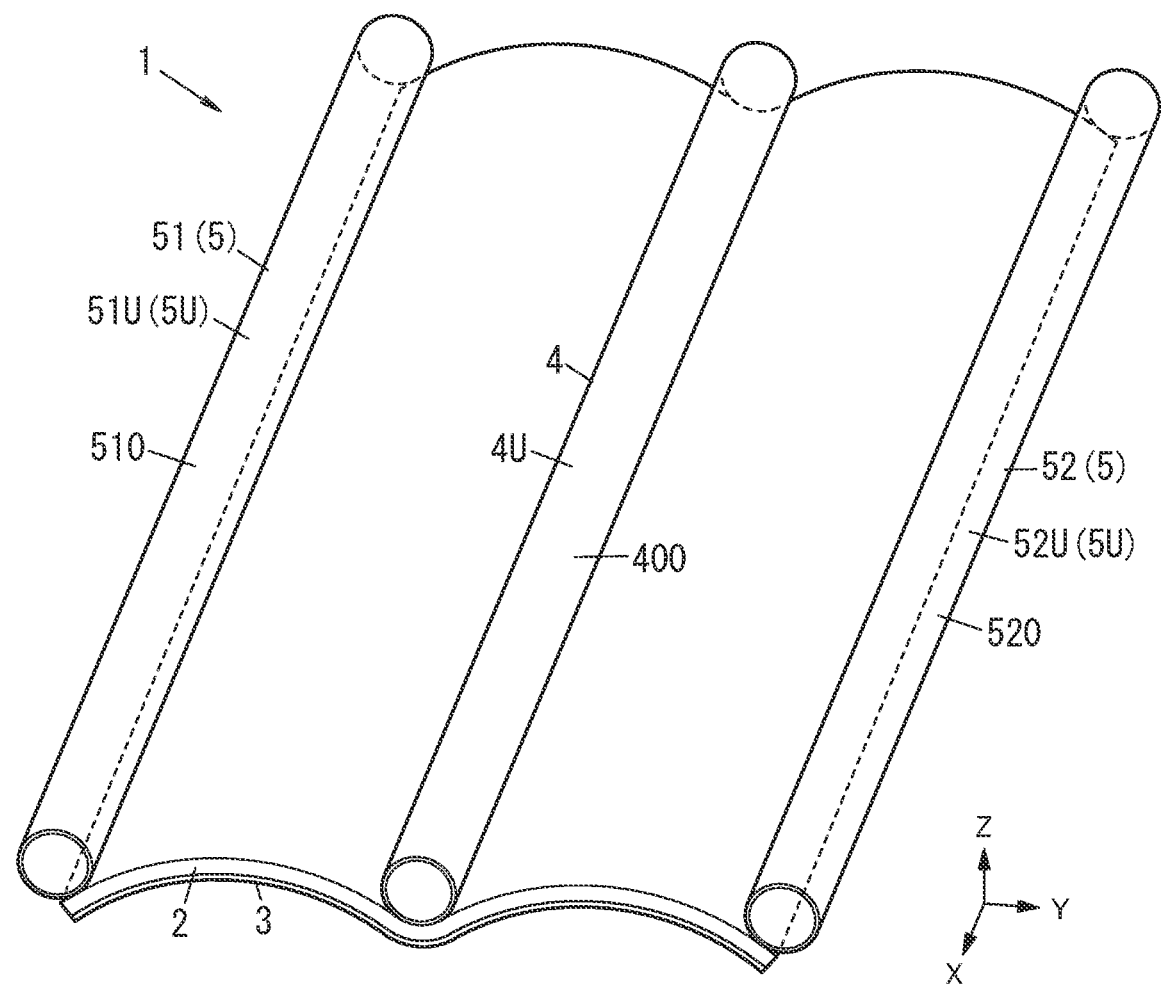
FIG. 1 is a perspective view of a proximity sensor of an embodiment.

A proximity sensor, a control system, and equipment according to an embodiment will be described with reference to the drawings. Note that the embodiment described below is a mere example of various embodiments of the present disclosure. Various modifications may be made to the following embodiment depending on design and the like as long as the object of the present disclosure is achieved. Moreover, figures described in the following embodiment are schematic views, and therefore, the ratio of sizes and the ratio of thicknesses of components in the drawings do not necessarily reflect actual dimensional ratios. Moreover, components common in the embodiment and variations are denoted by the same reference signs, and redundant description will accordingly be omitted.

(1) Overview

Figure 2:
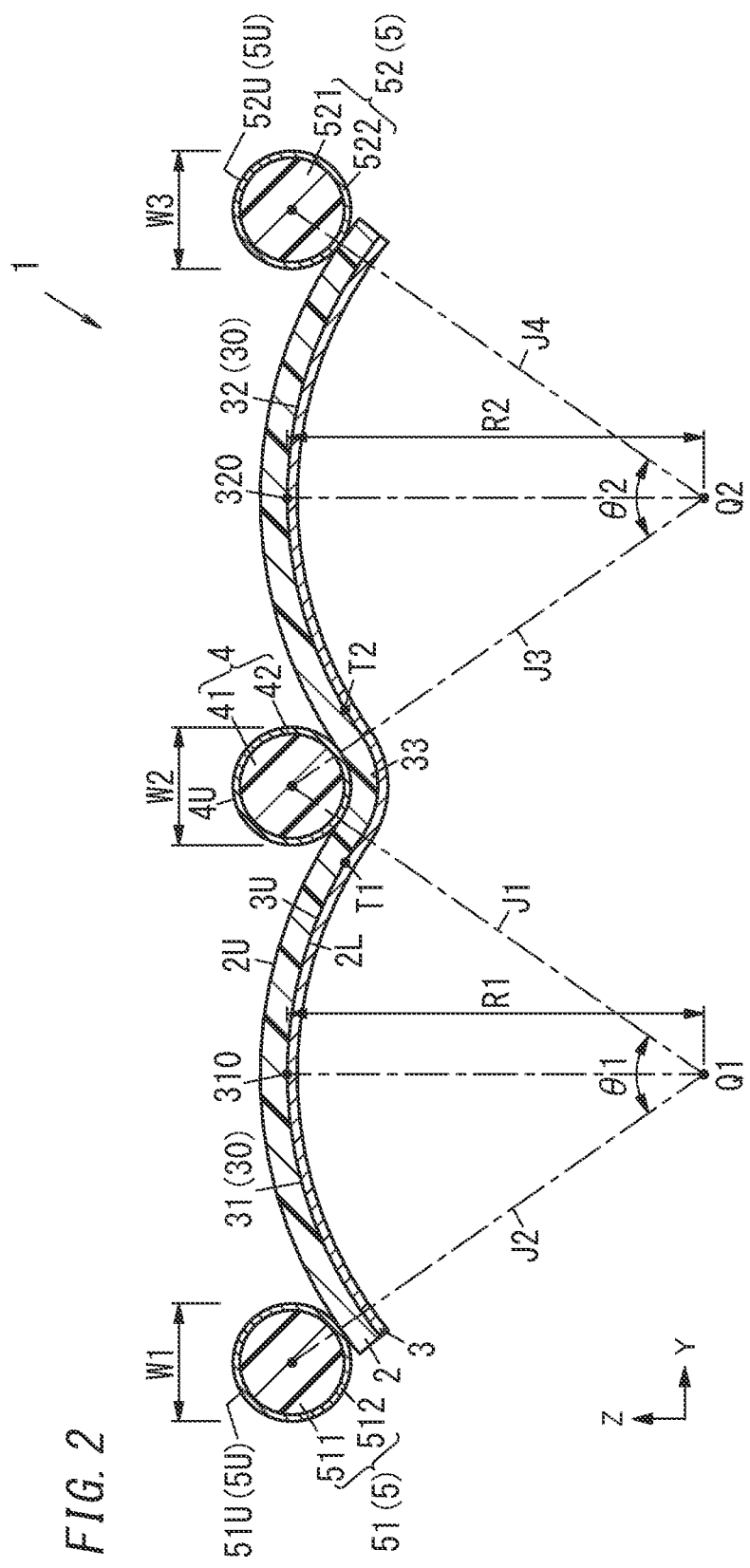
FIG. 2 is a sectional view of the proximity sensor.
Figure 3:
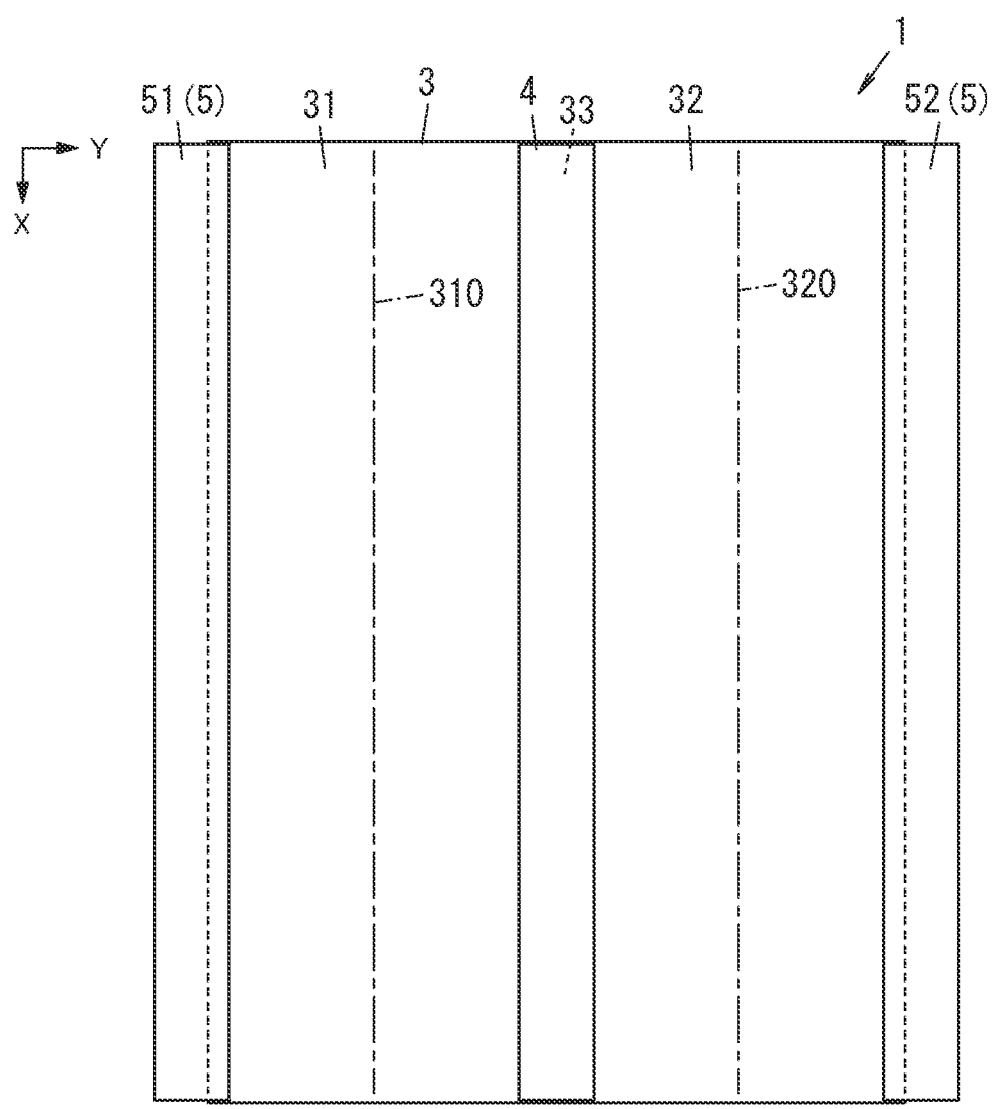
FIG. 3 is a plan view of the proximity sensor.

As shown in FIGS. 1 to 3, a proximity sensor 1 of the present embodiment is a mutual capacitance proximity sensor. The proximity sensor 1 includes a conductor 3, a receiving electrode 4, and a transmission electrode 5. The conductor 3 has an upper surface 3U. The receiving electrode 4 is separate from the upper surface 3U of the conductor 3 in an upward direction and extends along a first direction. The first direction is orthogonal to the upward direction. The transmission electrode 5 is separate from the upper surface 3U of the conductor 3 in the upward direction and extends along the first direction. The transmission electrode 5 and the receiving electrode 4 are aligned with each other in a second direction. The second direction is orthogonal to both the upward direction and the first direction. The transmission electrode 5 has an upper surface 5U having a shape bulging in the upward direction in a cross section orthogonal to the first direction.

To the transmission electrode 5, a prescribed voltage is applied. This drives the transmission electrode 5, and the transmission electrode 5 outputs a signal (electric field) to a space. The receiving electrode 4 receives the signal via the space from the transmission electrode 5. Thus, the receiving electrode 4 obtains an output according to the magnitude of an electrostatic capacitance formed between the transmission electrode 5 and the receiving electrode 4. In a space in the upward direction viewed from the proximity sensor 1, a sensing target approaching the proximity sensor 1 inhibits a capacitively coupled state between the transmission electrode 5 and the receiving electrode 4, thereby reducing the electrostatic capacitance. Thus, the proximity sensor 1 can sense the sensing target located in the upward direction viewed from the proximity sensor 1. The sensing target is, for example, a person. Note that the conductor 3 functions as an electrostatic shield.

In the present embodiment, the area of the upper surface 5U of the transmission electrode 5 is larger than in the case where the upper surface 5U of the transmission electrode 5 is a flat surface. This increases a change amount in the electrostatic capacitance when the sensing target approaches the proximity sensor 1, thereby improving detection sensitivity to the sensing target. Moreover, a sensing target which is relatively far away can be sensed.

In the present embodiment, the first direction, the second direction, and the upward direction are defined as described below by using an X axis, a Y axis, and a Z axis (see, for example, FIG. 1) orthogonal to one another. That is, an X-axis direction is defined as the first direction, a Y-axis direction is defined as the second direction, a Z-axis direction is defined as an up/down direction, and the positive direction of the Z axis is defined as the upward direction. Moreover, the negative direction of the Z axis is defined as a downward direction. Note that "orthogonal" as mentioned in the present disclosure is not limited to referring to that two objects intersect each other at an angle of exactly 90 degrees, but the two objects intersect each other at an angle deviating slightly (by a few degrees) from 90 degrees are also regarded as being "orthogonal". Moreover, arrows representing the X axis, the Y axis, and the Z axis in the drawings are shown for the sake of description and are intangible.

The "upward direction" as mentioned in the present disclosure merely means a side on which the receiving electrode 4 and the transmission electrode 5 are disposed when viewed from the conductor 3. The proximity sensor 1 may be used in an orientation in which the "upward direction" as mentioned in the present disclosure is, for example, the downward direction, the forward direction, the backward direction, the left direction, or the right direction.

The "downward direction" as mentioned in the present disclosure merely means a side on which the conductor 3 is disposed when viewed from the receiving electrode 4 and the transmission electrode 5. The proximity sensor 1 may be used in an orientation in which the "downward direction" as mentioned in the present disclosure is, for example, the upward direction, the forward direction, the backward direction, the left direction, or the right direction.

The "upper surface" of a component as mentioned in the present disclosure means an upward surface of the component. The "lower surface" of a component as mentioned in the present disclosure means a downward surface of the component. In the present embodiment, the transmission electrode 5 has a cylindrical shape, and of a side surface of the transmission electrode 5, a tip end in the upward direction and a tip end in a direction (Y-axis direction) orthogonal to the upward direction are connected to each other via a curved surface constituting the side surface. In such a case, the upper surface 5U of the transmission electrode 5 is a region which is part of the side surface of the transmission electrode 5 and which is located above the center of the transmission electrode 5 in the up/down direction.

The "upper end" as mentioned in the present disclosure means a tip end in the upward direction.

The proximity sensor 1 of the present embodiment includes a plurality of (in FIG. 1, two) transmission electrodes 5. In the following description, in order to distinguish the two transmission electrodes 5 from each other, one of the transmission electrodes 5 may be referred to as a first transmission electrode 51 and the other of the transmission electrodes 5 may be referred to as a second transmission electrode 52.

(2) Control System and Equipment

Figure 4:
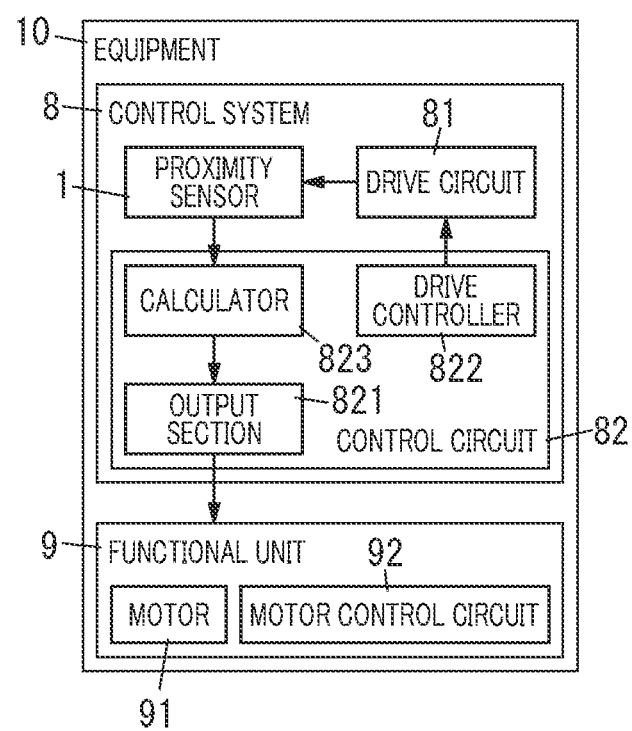
FIG. 4 is a block diagram of equipment including the proximity sensor.

As shown in FIG. 4, equipment 10 includes a control system 8 and a functional unit 9. The functional unit 9 includes, for example, a motor 91, and a motor control circuit 92 configured to control operation of the motor 91. The control system 8 controls operation of the functional unit 9.

The control system 8 includes the proximity sensor 1, a drive circuit 81, and a control circuit 82. The control circuit 82 includes an output section 821, a drive controller 822, and a calculator 823.

The equipment 10 is, for example, a robot arm. The proximity sensor 1 is attached to a structural part of the robot arm. The motor 91 of the functional unit 9 produces drive power which mechanically drives the robot arm.

The control circuit 82 includes a computer system including one or more processors and memory. The one or more processors of the computer system execute a program stored in the memory of the computer system, thereby implementing at least some functions of the control circuit 82. The program may be stored in the memory in advance, may be provided over a telecommunications network such as the Internet, or may be distributed as a non-transitory recording medium such as a memory card storing the program.

The drive circuit 81 includes an oscillation circuit. The drive circuit 81 applies a drive voltage between the first transmission electrode 51 of the proximity sensor 1 and a ground (reference potential) and between the second transmission electrode 52 of the proximity sensor 1 and the ground (reference potential). The drive voltage has, for example, a rectangular waveform.

The drive controller 822 controls the drive circuit 81. Thus, the drive controller 822 controls a timing at which the drive circuit 81 applies the drive voltage between the first transmission electrode 51 and the ground and between the second transmission electrode 52 and the ground. The timing at which the drive voltage is applied to the first transmission electrode 51 and the timing at which the drive voltage is applied to the second transmission electrode 52 are preferably the same timings.

In response to the application of the drive voltage between the ground and the transmission electrodes 5 (the first transmission electrode 51 and the second transmission electrode 52), an output corresponding to the magnitude of the electrostatic capacitance between the ground and both the first transmission electrode 51 and the second transmission electrode 52 is produced at the receiving electrode 4 of the proximity sensor 1. The output is a voltage signal having an amplitude proportional to, for example, the electrostatic capacitance. The output of the receiving electrode 4 is detected by a detection circuit of the control circuit 82 and is obtained as an output from the proximity sensor 1. In the following description, the magnitude of the electrostatic capacitance between the first transmission electrode 51 and the receiving electrode 4 is referred to as an "electrostatic capacitance $C1$", the magnitude of the electrostatic capacitance between the second transmission electrode 52 and the receiving electrode 4 is referred to as an "electrostatic capacitance $C2$", and a composite capacitance of the electrostatic capacitances $C1$ and $C2$ is referred to as an "electrostatic capacitance $C3$" ($C3=C1+C2$). The output of the receiving electrode 4 is an output according to the magnitude of the electrostatic capacitance $C3$.

The calculator 823 of the control circuit 82 generates a control signal in accordance with the output obtained from the receiving electrode 4 of the proximity sensor 1. The output section 821 outputs the control signal generated by the calculator 823 to the functional unit 9 of the equipment 10. Thus, the functional unit 9 operates in accordance with the control signal. That is, the output section 821 outputs the control signal to control the equipment 10. Thus, the functional unit 9 operates in accordance with the output from the proximity sensor 1.

The calculator 823 is configured to sense the electrostatic capacitance $C3$ by conventionally known various methods (e.g., a switched capacitor method). The calculator 823 generates a control signal in accordance with the electrostatic capacitance $C3$ thus sensed. Specifically, the calculator 823 calculates a distance between the sensing target and the proximity sensor 1 in accordance with the electrostatic capacitance $C3$. If the value of the distance thus calculated is less than or equal to a predetermined threshold, the calculator 823 generates a control signal for suppressing the operation of the functional unit 9. In contrast, if the value of the distance thus calculated is greater than the predetermined threshold, the calculator 823 generates no control signal. Controlling the operation of the functional unit 9 means, for example, reducing the speed of the motor 91 of the functional unit 9 or stopping the operation of the functional unit 9.

Here, provided that the equipment 10 is a robot arm, an example of an application of the proximity sensor 1 will be described. When a person (sensing target) approaches the proximity sensor 1 of the robot arm, the electrostatic capacitance $C3$, which the calculator 823 senses by using the proximity sensor 1, changes. The calculator 823 calculates a distance between the robot arm and the person in accordance with the electrostatic capacitance $C3$ thus sensed. If the value of the distance calculated by the calculator 823 is less than or equal to the predetermined threshold, the output section 821 outputs, to the functional unit 9, a control signal for suppressing the operation of the robot arm. In response to the control signal, the motor control circuit 92 of the functional unit 9 reduces the speed of the motor 91 or stops the motor 91.

(3) Electrostatic Capacitance and Sensing of Location

The calculator 823 senses the electrostatic capacitance $C3$ by, for example, a switched capacitor method. The switched capacitor method senses (a change in) the electrostatic capacitance of a target capacitor in accordance with the amount of electric charges stored in the target capacitor whose electrostatic capacitance is to be sensed. Here, the target capacitor includes a capacitor including the first transmission electrode 51 and the receiving electrode 4 as a pair of counter electrodes and a capacitor including the second transmission electrode 52 and the receiving electrode 4 as a pair of counter electrodes.

For example, in the switched capacitor method, a charging process and a discharge process are alternately repeated for a predetermined period of time. The charging process is a process of charging the target capacitor. The discharging process is a process of charging a determination capacitor with electric charges stored in the target capacitor by making the target capacitor discharge. When a voltage across the determination capacitor reaches a prescribed value, the discharging process is ended, and the charging process is started. Accordingly, the number of times that the voltage across the determination capacitor reaches the prescribed value within the predetermined time increases with increase in electrostatic capacitance of the target capacitor. Thus, the electrostatic capacitance of the target capacitor can be sensed based on the number of times that the voltage across the determination capacitor reaches the prescribed value within the predetermined time.

Next, sensing the location of the sensing target will be described.

Each transmission electrode 5 radiates an electric field. At least part of the electric field radiated from each transmission electrode 5 is directed to the receiving electrode 4. The control circuit 82 senses the distance between the sensing target and the proximity sensor 1 in accordance with the output obtained from the receiving electrode 4.

As the sensing target approaches the first transmission electrode 51, an increased proportion of lines of electrical force formed between the first transmission electrode 51 and the receiving electrode 4 is absorbed by the sensing target, thereby reducing coupling capacitance between the first transmission electrode 51 and the receiving electrode 4, so that the electrostatic capacitance C1 decreases. As the sensing target moves away from the first transmission electrode 51, a reduced proportion of the lines of electrical force formed between the first transmission electrode 51 and the receiving electrode 4 is absorbed by the sensing target, so that the electrostatic capacitance C1 increases.

As the sensing target approaches the second transmission electrode 52, an increased proportion of lines of electrical force formed between the second transmission electrode 52 and the receiving electrode 4 is absorbed by the sensing target, thereby reducing the coupling capacitance between the second transmission electrode 52 and the receiving electrode 4, so that the electrostatic capacitance C2 decreases. As the sensing target moves away from the second transmission electrode 52, a decreased proportion of the lines of electrical force formed between the second transmission electrode 52 and the receiving electrode 4 is absorbed by the sensing target, so that the electrostatic capacitance C2 increases.

Thus, as the sensing target approaches the proximity sensor 1, the electrostatic capacitance C3 decreases, whereas as the sensing target moves away from the proximity sensor 1, the electrostatic capacitance C3 increases.

Thus, the calculator 823 calculates the distance between the sensing target and the proximity sensor 1 in accordance with the electrostatic capacitance C3. As the electrostatic capacitance C3 decreases, the distance calculated by the calculator 823 decreases.

(4) Configuration of Proximity Sensor

As shown in FIG. 2, the proximity sensor 1 further includes a base 2 in addition to the first transmission electrode 51, the second transmission electrode 52, the receiving electrode 4, and the conductor 3. In FIG. 3, the base 2 is omitted.

The base 2 may be made of, for example, a synthetic resin. The base 2 is electrically insulating. The base 2 has a lower surface 2L and an upper surface 2U. The conductor 3 is disposed on the lower surface 2L. More specifically, the lower surface 2L is in contact with an upper surface 3U of the conductor 3. The first transmission electrode 51, the second transmission electrode 52, and the receiving electrode 4 are arranged on the upper surface 2U.

The base 2 has a substantially uniform thickness across its entirety. The upper surface 2U and the lower surface 2L of the base 2 are both surfaces of the base 2 in a thickness direction defined with respect to the base 2. The conductor 3 covers the entirety of the lower surface 2L of the base 2. The conductor 3 has a substantially uniform thickness across its entirety. Thus, the conductor 3 has a shape along the base 2.

The thickness of the conductor 3 is less than the thickness of the base 2. The conductor 3 has, for example, a shape of the base 2 compressing in the thickness direction.

The conductor 3 is made of metal. The conductor 3 is (electrically) connected to the ground. The conductor 3 functions as an electrostatic shield.

As shown in FIG. 2, the upper surface 3U of the conductor 3 includes a first convex region 31, a second convex region 32, and a concave region 33. The first convex region 31 has a shape extending along the X-axis direction (first direction) and bulging in the upward direction. The second convex region 32 has a shape extending along the X-axis direction (first direction) and bulging in the upward direction. That is, the first convex region 31 and the second convex region 32 are each in the shape of a trajectory (cylindrical surface) drawn by moving, along the X-axis direction, a curved line which is convex upward. The concave region 33 is provided at a location which is between an upper end 310 of the first convex region 31 and an upper end 320 of the second convex region 32 in the Y-axis direction (second direction) and which is under the receiving electrode 4. The concave region 33 has a shape extending along the X-axis direction (first direction) and recessed in the downward direction. That is, the concave region 33 has the shape of a trajectory (cylindrical surface) drawn by moving, along the X-axis direction, a curved line which is convex downward.

In the following description, each of the first convex region 31 and the second convex region 32 may be referred to as a convex region 30.

As shown in FIG. 2, each of the first convex region 31 and the second convex region 32 has a circular arc shape in a cross section orthogonal to the X-axis direction (first direction). The shape of the first convex region 31 is the same as the shape of the second convex region 32. The Z coordinate of a center of curvature Q1 of the first convex region 31 is equal to the Z coordinate of a center of curvature Q2 of the second convex region 32. Regarding locations, dimensions, and shapes of objects, "equal" as mentioned in the present disclosure is not limited to referring to the state of being exactly equal but includes cases where the objects differ in terms of location, dimension, and/or shape within a range causing no practical problem. For example, if the difference between two values is less than 5%, the present disclosure may be applied by regarding these values as being "equal" to each other.

Part of the concave region 33 also serves as a part near one end T1 of the first convex region 31 in the positive direction of the Y axis. Another part of the concave region 33 also serves as a part near one end T2 of the second convex region 32 in the negative direction of the Y axis. In the cross section orthogonal to the X-axis direction (first direction), the concave region 33 has a U-shape or a V-shape formed by the part near the one end T1 of the first convex region 31 and the part near the one end T2 of the second convex region 32. In FIG. 2, the one end T1 and the one end T2 are shown for convenience of explanation, but locations of the one end T1 and the one end T2 are not limited to this example.

As shown in FIG. 3, when viewed from above, the upper end 310 of the first convex region 31 is located between the first transmission electrode 51 and the receiving electrode 4. When viewed from above, the upper end 320 of the second convex region 32 is located between the second transmission electrode 52 and the receiving electrode 4. When viewed from above, the conductor 3 has a rectangular shape. The term "rectangle" is a concept that includes an equiangular quadrilateral and a square. In the present embodiment, the length of the conductor 3 in the X-axis direction is greater than the length of the conductor 3 in the Y-axis direction.

As shown in FIG. 2, the first transmission electrode 51 includes a first core member 511 and a first conductive layer 512. The receiving electrode 4 includes a second core member 41 and a second conductive layer 42. The second transmission electrode 52 includes a third core member 521 and a third conductive layer 522.

The first core member 511, the second core member 41, and the third core member 521 are each, for example, electrically insulating. The first core member 511, the second core member 41, and the third core member 521 may be made of, for example, a synthetic resin. The first conductive layer 512 covers the first core member 511. The second conductive layer 42 covers the second core member 41. The third conductive layer 522 covers the third core member 521. The first conductive layer 512, the second conductive layer 42, and the third conductive layer 522 are made of metal.

The first transmission electrode 51, the second transmission electrode 52, and the receiving electrode 4 have the same structures and dimensions.

The first core member 511 of the first transmission electrode 51 has a cylindrical shape. The axial direction of the first core member 511 is along the X-axis direction. The first conductive layer 512 covers a side surface of the first core member 511. Thus, the first transmission electrode 51 has a cylindrical shape.

The second core member 41 of the receiving electrode 4 has a cylindrical shape. The axial direction of the second core member 41 is along the X-axis direction. The second conductive layer 42 covers a side surface of the second core member 41. Thus, the receiving electrode 4 has a cylindrical shape.

The third core member 521 of the second transmission electrode 52 has a cylindrical shape. The axial direction of the third core member 521 is along the X-axis direction. The third conductive layer 522 covers a side surface of the third core member 521. Thus, the second transmission electrode 52 has a cylindrical shape.

The axial direction of each of the first transmission electrode 51, the second transmission electrode 52, and the receiving electrode 4 is along the X-axis direction. When viewed from above, each of the first transmission electrode 51, the second transmission electrode 52, and the receiving electrode 4 has a first end overlapping a first end of the conductor 3 in the X-axis direction. When viewed from above, each of the first transmission electrode 51, the second transmission electrode 52, and the receiving electrode 4 has a second end overlapping a second end of the conductor 3 in the X-axis direction.

As shown in FIG. 2, in the cross section orthogonal to the X-axis direction (first direction), an upper surface 51U of the first transmission electrode 51 and an upper surface 52U of the second transmission electrode 52 each have a shape bulging in the upward direction. More specifically, in the cross section orthogonal to the X-axis direction (first direction), the upper surface 51U of the first transmission electrode 51 and the upper surface 52U of the second transmission electrode 52 each have a circular arc shape.

Moreover, as described above, the first transmission electrode 51 and the second transmission electrode 52 each have a cylindrical shape. Thus, in the cross section orthogonal to the X-axis direction (first direction), each of the first transmission electrode 51 and the second transmission electrode 52 has a circular shape.

Each of the first transmission electrode 51 and the second transmission electrode 52 is separate from the upper surface 3U of the conductor 3 in the upward direction. In other words, each of the first transmission electrode 51 and the second transmission electrode 52 is arranged with a prescribed distance from the upper surface 3U of the conductor 3. More specifically, between the upper surface 3U of the conductor 3 and each of the first transmission electrode 51 and the second transmission electrode 52, the base 2 is sandwiched, and at least a distance corresponding to the thickness of the base 2 is provided.

Each of the first transmission electrode 51 and the second transmission electrode 52 extends along the X-axis direction (first direction). The first transmission electrode 51 is disposed on a side, with respect to the receiving electrode 4, in one direction (in the negative direction of the Y axis) of both directions parallel to the Y-axis direction (second direction). The second transmission electrode 52 is disposed on a side, with respect to the receiving electrode 4, in the other direction (in the positive direction of the Y axis) of both the directions parallel to the Y-axis direction (second direction).

In the cross section orthogonal to the X-axis direction (first direction), the receiving electrode 4 has an upper surface 4U having a shape bulging in the upward direction. More specifically, in the cross section orthogonal to the X-axis direction (first direction), the upper surface 4U of the receiving electrode 4 has a circular arc shape.

Moreover, as described above, the receiving electrode 4 has a cylindrical shape. Thus, in the cross section orthogonal to the X-axis direction (first direction), the receiving electrode 4 has a circular shape.

The first transmission electrode 51, the second transmission electrode 52, and the receiving electrode 4 have the same diameters and have the same lengths along the first direction. Thus, the surface area of an outer peripheral surface of the first transmission electrode 51, the surface area of an outer peripheral surface of the second transmission electrode 52, and the surface area of an outer peripheral surface of the receiving electrode 4 are equal to one another.

The receiving electrode 4 is separate from the upper surface 3U of the conductor 3 in the upward direction. More specifically, between the receiving electrode 4 and the upper surface 3U of the conductor 3, the base 2 is sandwiched, and at least a distance corresponding to the thickness of the base 2 is provided.

In the cross section orthogonal to the X-axis direction (first direction), an angle $\theta 1$ formed between a first line segment J1 connecting the center of curvature Q1 of the first convex region 31 to the receiving electrode 4 and a second line segment J2 connecting the center of curvature Q1 of the first convex region 31 to the first transmission electrode 51 is preferably greater than or equal to 60 degrees and less than or equal to 180 degrees. In the present embodiment, the angle θ1 is about 70 degrees. Moreover, the angle θ1 is divided into two equal angles by a line segment connecting the upper end 310 of the first convex region 31 to the center of curvature Q1. Here, the first line segment J1 is defined as a line segment connecting the center of curvature Q1 to the center of the receiving electrode 4. The second line segment J2 is defined as a line segment connecting the center of curvature Q1 to the center of the first transmission electrode 51.

In the cross section orthogonal to the X-axis direction (first direction), an angle θ2 formed between a line segment J3 connecting the center of curvature Q2 of the second convex region 32 to the receiving electrode 4 and a line segment J4 connecting the center of curvature Q2 of the second convex region 32 to the second transmission electrode 52 is preferably greater than or equal to 60 degrees and less than or equal to 180 degrees. In the present embodiment, the angle θ2 is about 70 degrees. Moreover, the angle θ2 is divided into two equal angles by a line segment connecting the upper end 320 of the second convex region 32 to the center of curvature Q2. Here, the line segment J3 is defined as a line segment connecting the center of curvature Q2 to the center of the receiving electrode 4. The line segment J4 is defined as a line segment connecting the center of curvature Q2 to the center of the second transmission electrode 52.

In the cross section orthogonal to the X-axis direction (first direction), a radius of curvature R1 of the first convex region 31 is preferably ¼ or more times and 4 or less times a width W1 of the first transmission electrode 51 (diameter of the first transmission electrode 51) in the Y-axis direction (second direction). In the present embodiment, the radius of curvature R1 is preferably about 3.5 times the width W1. Moreover, in the cross section, the radius of curvature R1 is preferably ¼ or more times and 4 or less times a width W2 of the receiving electrode 4 (diameter of the receiving electrode 4) in the Y-axis direction (second direction).

Moreover, in the cross section, a radius of curvature R2 of the second convex region 32 is preferably ¼ or more times and 4 or less times a width W3 of the second transmission electrode 52 in the Y-axis direction (second direction). Moreover, in the cross section, the radius of curvature R2 is preferably ¼ or more times and 4 or less times the width W2 of the receiving electrode 4 (diameter of the receiving electrode 4) in the Y-axis direction (second direction). In the present embodiment, the radius of curvature R1 is equal to the radius of curvature R2. Moreover, the widths W1, W2, and W3 are equal to each other.

(5) Advantages

Figure 5:
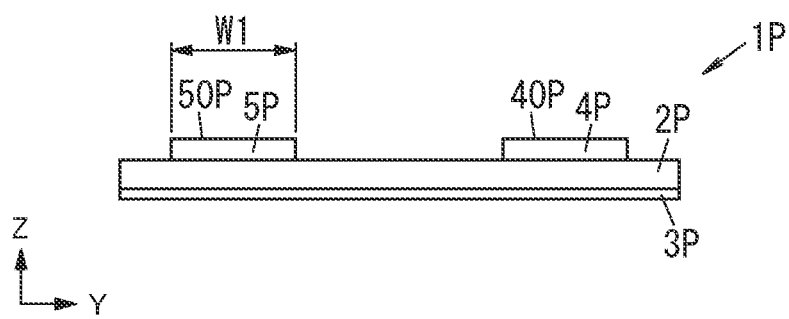
FIG. 5 is a front view of a proximity sensor of a comparative example.

FIG. 5 shows a proximity sensor 1P according to a comparative example. The proximity sensor 1P includes a transmission electrode 5P, a receiving electrode 4P, a conductor 3P, and a base 2P. The transmission electrode 5P has a flat plate shape, and the transmission electrode 5P has an upper surface 50P which is planar. The receiving electrode 4P has a flat plate shape, and the receiving electrode 4P has an upper surface 40P which is planar.

In contrast, in the proximity sensor 1 of the embodiment, the upper surface 5U of the transmission electrode 5 has a shape bulging in the upward direction in the cross section orthogonal to the X-axis direction (first direction). Thus, provided that the width W1 of the transmission electrode 5 in the Y-axis direction is equal to the width W1 of the transmission electrode 5P in the Y-axis direction, the area of the upper surface 5U of the transmission electrode 5 in the embodiment is greater than the area of the upper surface 50P of the transmission electrode 5P in the comparative example. Therefore, in the embodiment, a change amount in the electrostatic capacitance between the transmission electrode 5 and the receiving electrode 4 when a sensing target located above the proximity sensor 1 approaches the proximity sensor 1 is greater than in the case of the proximity sensor 1P of the comparative example. That is, minuter movement of the sensing target can be sensed in the embodiment than in the comparative example. In other words, detection sensitivity to the sensing target is higher in the embodiment than in the comparative example. Moreover, a farther sensing target can be sensed in the embodiment than in the comparative example.

(6) First to Third Variations

Proximity sensors 1A to 1C respectively according to first to third variations of the embodiment will be described below. The proximity sensors 1A to 1C each include only one transmission electrode 5.

Figure 6:
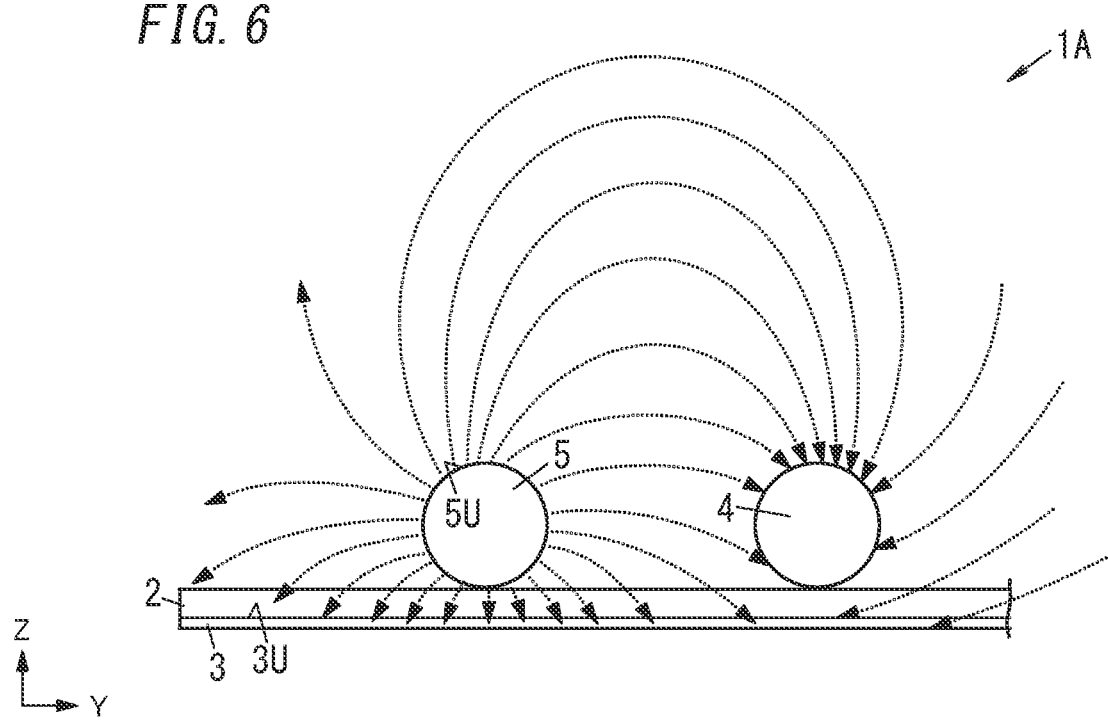
FIG. 6 is a front view of a proximity sensor of a first variation.

FIG. 6 shows the proximity sensor 1A according to the first variation of the embodiment and distribution of lines of electrical force (shown in dotted line) in the proximity sensor 1A. In the proximity sensor 1A of the first variation, the shape of a conductor 3 is different from the shape of the conductor 3 in the proximity sensor 1 of the embodiment. That is, the conductor 3 of the first variation has a flat plate shape. Thus, the conductor 3 of the first variation has an upper surface 3U which is planar. Moreover, a base 2 of the first variation has a flat plate shape.

In the proximity sensor 1A of the first variation, the transmission electrode 5 has an upper surface 5U having a shape bulging in the upward direction in the cross section orthogonal to the X-axis direction (first direction) in a similar manner to the proximity sensor 1 of the embodiment. Thus, detection sensitivity to a sensing target is higher than that of the proximity sensor 1P according to the comparative example.

Figure 7:
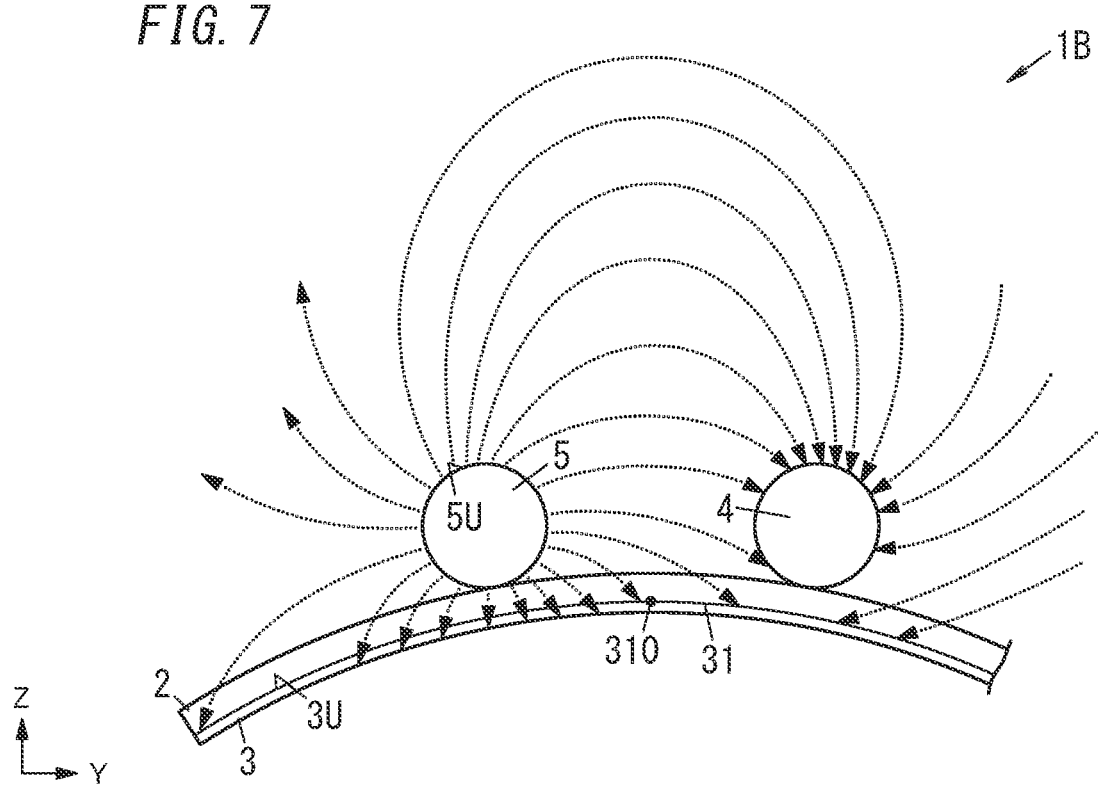
FIG. 7 is a front view of a proximity sensor of a second variation.

FIG. 7 shows the proximity sensor 1B according to the second variation of the embodiment and distribution of lines of electrical force (shown in dotted line) in the proximity sensor 1B. In FIG. 7, the arrangement of the transmission electrode 5 and a receiving electrode 4 is slightly different from that shown in FIG. 2, but when viewed from above, the arrangement is common to that shown in FIG. 2 in that an upper end 310 of a first convex region 31 is located between the transmission electrode 5 and the receiving electrode 4.

In FIG. 7, a plurality of lines of electrical force extending from a lower side region of the transmission electrode 5 include a smaller number of lines of electrical force toward a conductor 3 than in FIG. 6. This is because the conductor 3 includes the first convex region 31. That is, a distance (hereinafter referred to as a "target distance") between the center of the transmission electrode 5 and an arbitrary point (hereinafter referred to as a "reference point") of the conductor 3 except for a point at which a distance to the transmission electrode 5 is shortest is greater in FIG. 7 than in FIG. 6. More specifically, as the distance of the reference point from the transmission electrode 5 increases, the difference between the target distance in FIG. 6 and the target distance in FIG. 7 increases. As explained above, part of the conductor 3 is relatively far away from the transmission electrode 5 in FIG. 7, and therefore, the number of lines of electrical force from the transmission electrode 5 toward the conductor 3 is small.

In particular, in FIG. 7, the plurality of lines of electrical force extending from the lower side region of the transmission electrode 5 includes a larger number of lines of electrical force (hereinafter referred to as "first lines of electrical force") which go out in the negative direction (on a side opposite from the receiving electrode 4) of the Y-axis and which extend toward the receiving electrode 4 than in FIG. 6. The first lines of electrical force are more likely to be absorbed by the sensing target approaching the proximity sensor 1 than the lines of electrical force which go out from the lower side region of the transmission electrode 5 in the positive direction of the Y axis toward the receiving electrode 4, and therefore, the first lines of electrical force greatly contribute to the detection sensitivity to the sensing target.

Thus, in FIG. 7, the plurality of lines of electrical force extending from the lower side region of the transmission electrode 5 include a smaller number of lines of electrical force toward the conductor 3 and a larger number of first lines of electrical force toward the receiving electrode 4 than in FIG. 6. Thus, when attention is directed toward the electrostatic capacitance between the transmission electrode 5 and the receiving electrode 4, a change amount in the electrostatic capacitance according to the movement of the sensing target is larger in the proximity sensor 1B of FIG. 7 than in the proximity sensor 1A of FIG. 6. That is, the proximity sensor 1B of FIG. 7 has higher detection sensitivity to the sensing target than the proximity sensor 1A of FIG. 6. For the same reason, the proximity sensor 1 of the embodiment has higher detection sensitivity to the sensing target than the proximity sensor 1A of FIG. 6.

Figure 8:
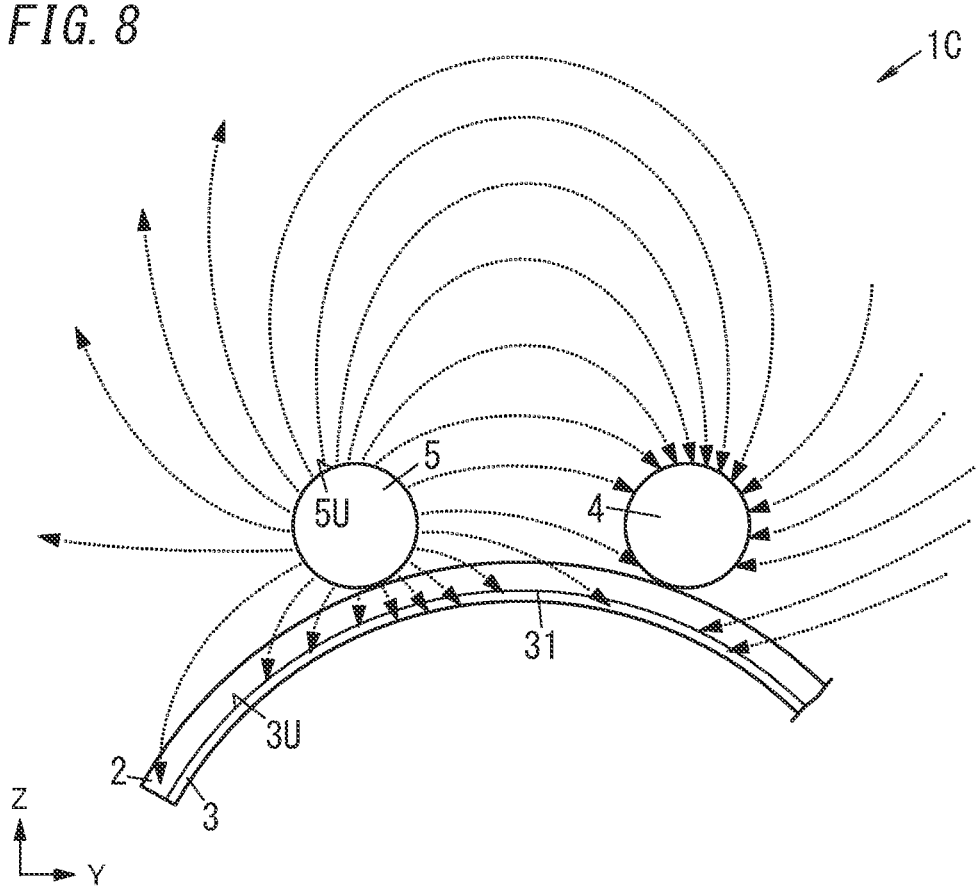
FIG. 8 is a front view of a proximity sensor of a third variation.

FIG. 8 shows the proximity sensor 1C according to the third variation of the embodiment and distribution of lines of electrical force (shown in dotted line) in the proximity sensor 1C. In the proximity sensor 1C, the radius of curvature of a first convex region 31 is smaller than that in the proximity sensor 1B shown in FIG. 7. Thus, in the proximity sensor 1C of FIG. 8, a plurality of lines of electrical force extending from a lower side region of the transmission electrode 5 includes a larger number of lines of electrical force toward a receiving electrode 4 than in the proximity sensor 1B of FIG. 7. Thus, the proximity sensor 1C in FIG. 8 has much higher detection sensitivity to the sensing target than the proximity sensor 1B of FIG. 7.

Figure 9:
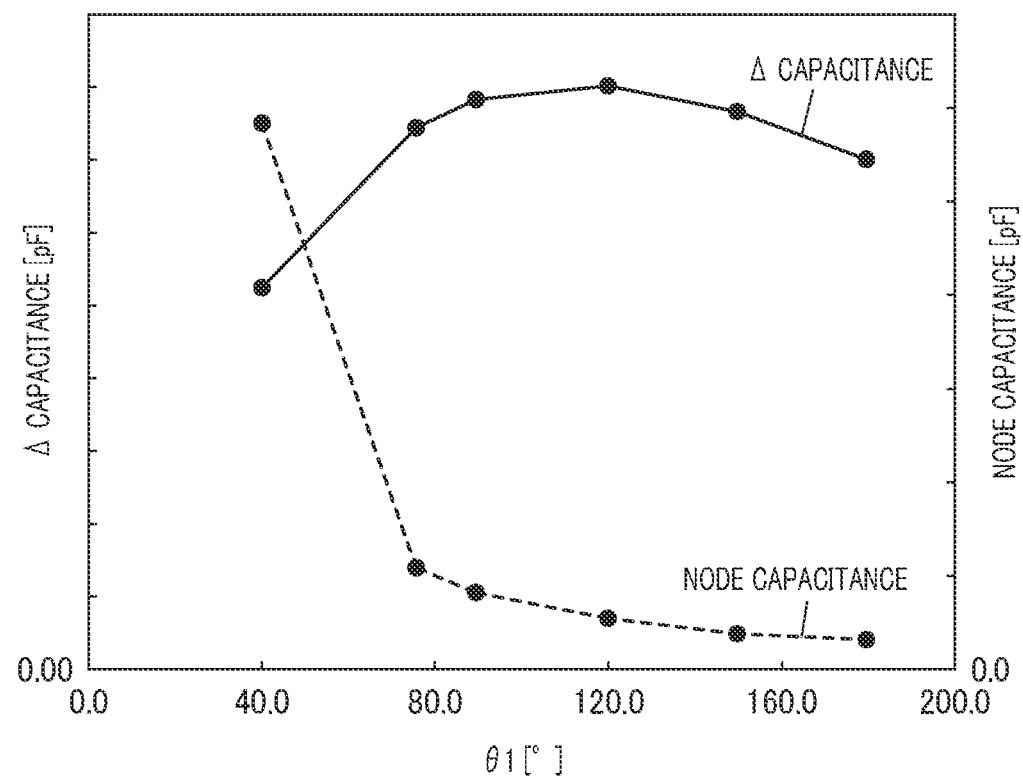
FIG. 9 is a graph of a relationship between detection sensitivity and an arrangement of a transmission electrode and a receiving electrode of a proximity sensor of an embodiment.

(7) Relationship Between Arrangement of Transmission Electrode and Receiving Electrode and Detection Sensitivity FIG. 9 is a graph showing the relationship between the angle θ1 (see FIG. 2) and the detection sensitivity of the proximity sensor 1. The angle θ1 is an angle formed, in the cross section orthogonal to the X-axis direction (first direction), by the first line segment J1 connecting the center of curvature Q1 of the first convex region 31 to the receiving electrode 4 and the second line segment J2 connecting the center of curvature Q1 of the first convex region 31 to the first transmission electrode 51. In the example shown in FIG. 9, the proximity sensor 1 includes only the first transmission electrode 51 of the first transmission electrode 51 and the second transmission electrode 52.

The electrostatic capacitance C1 between the first transmission electrode 51 and the receiving electrode 4 changes in accordance with the distance between the proximity sensor 1 and the sensing target. A node capacitance is the electrostatic capacitance C1 between the first transmission electrode 51 and the receiving electrode 4 in a state where no sensing target is present or in a state where a sensing target is out of a sensing range of the proximity sensor 1. A Δ capacitance (delta capacitance) is a value obtained by subtracting, from the node capacitance, the electrostatic capacitance C1 when a prescribed sensing target is disposed within the sensing range of the proximity sensor 1 and at a prescribed location away from the proximity sensor 1 by a certain distance. The node capacitance and the Δ capacitance were obtained by simulation. Each of the base 2 and the conductor 3 was formed to have a semicircular arc-shaped cross section, and the locations of the first transmission electrode 51 and the receiving electrode 4 were changed to change the angle θ1 in six ways. Each time the angle θ1 was changed, the node capacitance and the Δ capacitance were obtained. In FIG. 9, the scale of the node capacitance is different from the scale of the Δ capacitance.

As shown in FIG. 9, when the angle θ1 is within a range from greater than or equal to 40 degrees to less than or equal to 180 degrees, the node capacitance decreases as the angle θ1 increases. Moreover, the Δ capacitance is maximum when the angle θ1 is 120 degrees. As the absolute value of a difference between the angle θ1 and 120 degrees increases, the capacitance decreases.

The larger the Δ capacitance, the minuter movement of the sensing target can be sensed. In other words, the larger the Δ capacitance, the higher the detection sensitivity to the sensing target. Moreover, the smaller the node capacitance, the smaller the magnitude of a signal (e.g., voltage signal) input from the proximity sensor 1 to the control circuit 82 (see FIG. 4), and therefore, a circuit having a relatively small input range may be employed as the control circuit 82. Thus, when a range in which the Δ capacitance is relatively large and the node capacitance is relatively small is identified based on FIG. 9, the angle θ1 is appropriately about 120 degrees. Moreover, a range in which the angle θ1 is greater than or equal to 60 degrees and less than or equal to 180 degrees is also appropriate.

Figure 10:
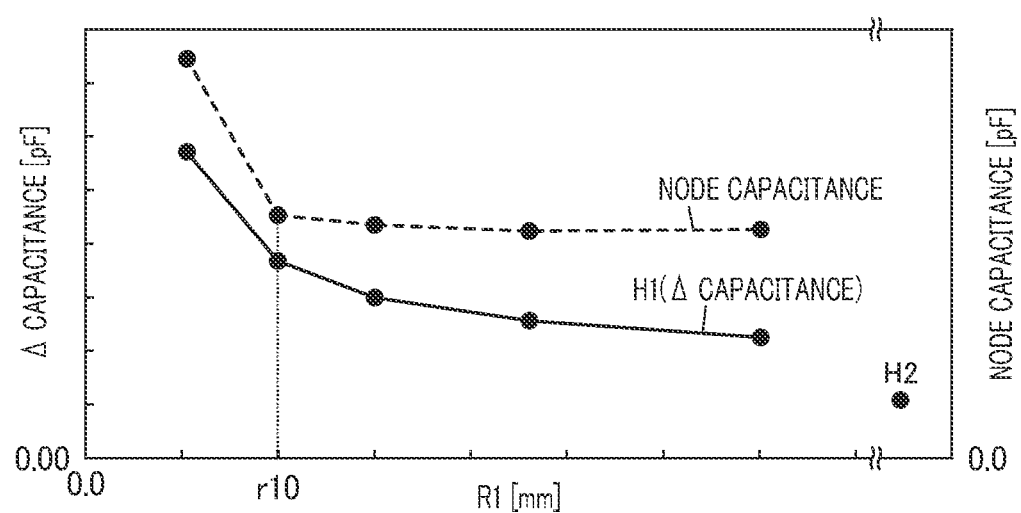
FIG. 10 is a graph of a relationship between a radius of curvature of a conductor and the detection sensitivity of the proximity sensor of the embodiment.

(8) Relationship Between Radius of Curvature of Conductor and Detection Sensitivity FIG. 10 is a graph of a relationship between the radius of curvature R1 of the convex region 30 of the conductor 3 and the node capacitance and a relationship between the radius of curvature R1 and the Δ capacitance. The node capacitance and the Δ capacitance were obtained by simulation. In FIG. 10, the scale of the node capacitance is different from the scale of the Δ capacitance.

In the example shown in FIG. 10, the proximity sensor 1 includes only the first transmission electrode 51 of the first transmission electrode 51 and the second transmission electrode 52. In FIG. 10, a polygonal line H1 represents the Δ capacitance in the case of the radius of curvature R1 being a finite value, and a point H2 represents the Δ capacitance in the case of the radius of curvature R1 being infinite, that is, in the case of the conductor 3 having a flat plate shape and having no convex region 30.

As shown in FIG. 10, when the conductor 3 has the convex region 30, the Δ capacitance is larger than when the conductor 3 has no convex region 30, and therefore, the detection sensitivity of the proximity sensor 1 is improved.

The conductor 3 is preferably designed, for example, such that the radius of curvature R1=r10 (see FIG. 10) so that the node capacitance is smaller than a prescribed magnitude and the Δ capacitance is relatively large.

The radius of curvature R1 is preferably ¼ or more times and 4 or less times the width W1 (see FIG. 2) of the first transmission electrode 51 in the Y-axis direction (second direction).

Figure 11:
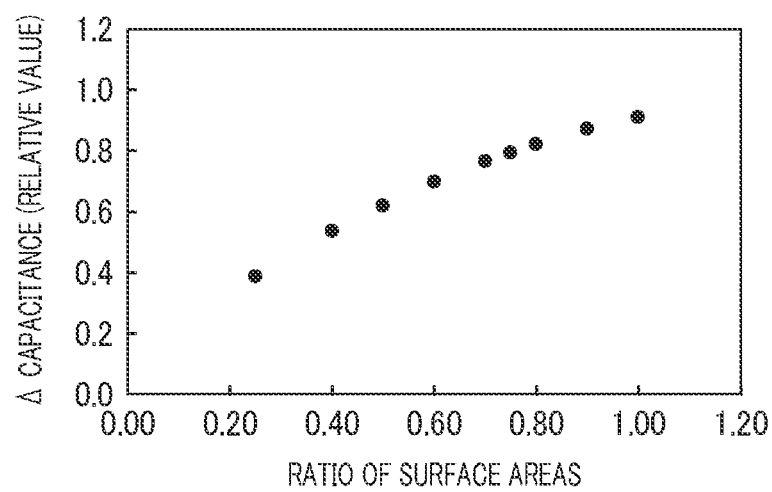
FIG. 11 is a graph of a relationship between a ratio of surface areas of the electrodes and the detection sensitivity of the proximity sensor of the embodiment.

(9) Relationship Between Ratio of Surface Areas of Electrodes and Detection Sensitivity In the example shown in FIG. 11, the proximity sensor 1 includes only the first transmission electrode 51 of the first transmission electrode 51 and the second transmission electrode 52. FIG. 11 is a graph of a relationship between an area ratio and the Δ capacitance. The Δ capacitance was obtained by simulation. The area ratio is a ratio of a surface area (hereinafter referred to as a "surface area S51") of an outer peripheral surface 510 (see FIG. 1), extending along the first direction, of the first transmission electrode 51 to a surface area (hereinafter referred to as a "surface area S4") of an outer peripheral surface 400 (see FIG. 1), extending along the first direction, of the receiving electrode 4. The outer peripheral surface 510 has the upper surface 51U, and the outer peripheral surface 400 has the upper surface 4U. In the following description, the area ratio is referred to as an "area ratio r1". In the case where S51<S4, the area ratio r1=S51/S4, and in the case where S4<S51, the area ratio r1=S4/S51, and the same results are obtained in both the cases. Note that the Δ capacitance in FIG. 11 is a relative value representing a ratio to a specific value, where the specific value is 1.0.

As shown in FIG. 11, as the area ratio r1 approaches 1.0, the Δ capacitance increases, and therefore, the detection sensitivity of the proximity sensor 1 is improved. In accordance with the sensitivity specification required for the proximity sensor 1, the surface areas S4 and S51 may accordingly be set. That is, the ratio of the area (the surface area S51) of the surface, extending in the first direction, of the first transmission electrode 51 to the area (the surface area S4) of the surface, extending in the first direction, of the receiving electrode 4 is preferably set in accordance with the sensitivity.

When the proximity sensor 1 includes two transmission electrodes 5 (the first transmission electrode 51 and the second transmission electrode 52) and one receiving electrode 4, the surface areas S51 and S4 and a surface area (hereinafter referred to as a "surface area S52") of an outer peripheral surface 520 (see FIG. 1, the outer peripheral surface 520 has the upper surface 52U), extending in the first direction, of the second transmission electrode 52 may be set as described below. That is, the area ratio r1 is redefined, and when (S51+S52)<S4, the area ratio r1=(S51+S52)/S4, and when S4<(S51+S52), the area ratio r1=S4/(S51+S52). Also in this case, as the area ratio r1 approaches 1.0, the Δ capacitance increases, and therefore, in accordance with the sensitivity specification required for the proximity sensor 1, the surface areas S4, S51, and S52 may accordingly be set. The area ratio r1 is greater than or equal to 0.7 for practical use. For example, S4:S51:S52=1.3:0.5:0.5. Alternatively, S4:S51:S52=1.0:0.35:0.35. Thus, the ratio of the area (the surface area S52) of the surface, extending in the first direction, of the second transmission electrode 52 to the area (the surface area S4) of the surface, extending in the first direction, of the receiving electrode 4 is preferably set in accordance with the sensitivity.

To enable the knowledge described above to be applied to the case where the proximity sensor 1 includes one or more receiving electrodes 4 and one or more transmission electrodes 5, the knowledge may be generalization as described below. That is, a ratio of the sum of the surface areas of side surfaces of the one or more receiving electrodes 4 to the sum of the surface areas of side surfaces of the one or more transmission electrodes 5 is set at least in accordance with the sensitivity. As the ratio approaches 1.0, the Δ capacitance could be considered to increase. The proximity sensor 1 is preferably configured such that the ratio is, for example, greater than or equal to 0.7.

Note that also when the shape of some electrodes of the one or more receiving electrodes 4 and the one or more transmission electrodes 5 is different from the shape of some other electrodes of the one or more receiving electrodes 4 and the one or more transmission electrodes 5, the ratio of the area of the surface, extending in the first direction, of each electrode is similarly preferably set in accordance with the sensitivity.

(10) Fourth to Sixth Variations

Figure 12:
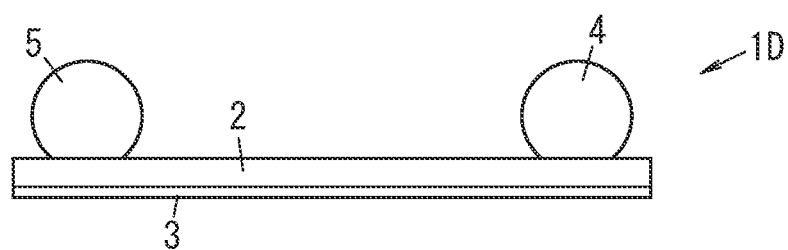
FIG. 12 is a front view of a proximity sensor of a fourth variation.
Figure 13:
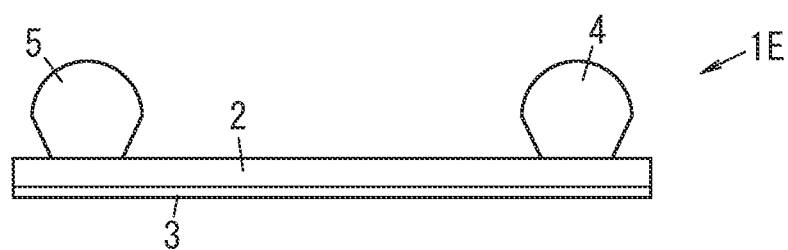
FIG. 13 is a front view of a proximity sensor of a fifth variation.
Figure 14:
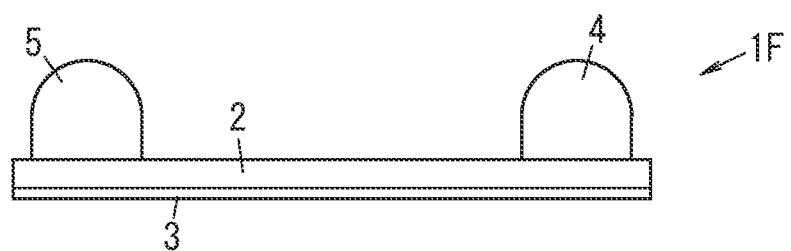
FIG. 14 is a front view of a proximity sensor of a sixth variation.

With reference to FIGS. 12 to 14, proximity sensors 1D to 1F respectively according to a fourth to sixth variations of the embodiment will be described below. Each of the proximity sensors 1D to 1F includes only one transmission electrode 5. The proximity sensors 1D to 1F are different from the proximity sensor of the embodiment in terms of shapes of the transmission electrode 5 and the receiving electrode 4 in the cross section orthogonal to the X-axis direction (first direction). Moreover, the proximity sensors 1D to 1F are different from the proximity sensor of the embodiment in that the conductor 3 and the base 2 each have a flat plate shape.

In the proximity sensor 1D, the shape of each of the transmission electrode 5 and the receiving electrode 4 in the cross section is the shape of a figure which is one of two figures obtained by dividing a circle by a line segment connecting two points on the circumference of the circle and which has a larger surface area than the other of the two figures. Each of the transmission electrode 5 and the receiving electrode 4 has a lower surface which includes the line segment and which is in contact with the base 2.

In the proximity sensor 1E, the shape of each of the transmission electrode 5 and the receiving electrode 4 in the cross section is the shape of a combination of a semicircle and an isosceles trapezoid whose upper base corresponds to the diameter of the semicircle. The upper base is longer than the lower base of the isosceles trapezoid. Each of the transmission electrode 5 and the receiving electrode 4 has a lower surface which includes the lower base of the isosceles trapezoid and which is in contact with the base 2.

In the proximity sensor 1F, the shape of each of the transmission electrode 5 and the receiving electrode 4 in the cross section is the shape of a combination of a semicircle and a rectangle whose one side is the diameter of the semicircle. Each of the transmission electrode 5 and the receiving electrode 4 has a lower surface which includes a side opposite to the one side of the rectangle, and the lower surface is in contact with the base 2.

(11) Seventh to Ninth Variation

Figure 15:
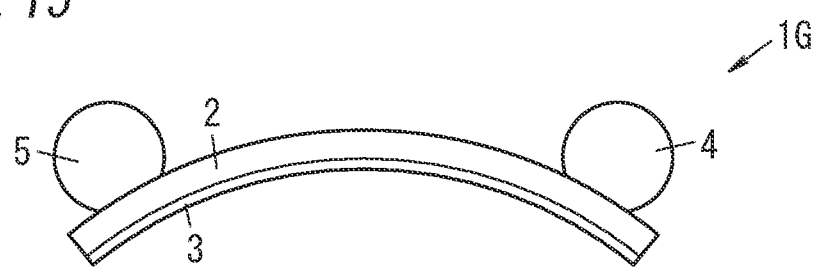
FIG. 15 is a front view of a proximity sensor of a seventh variation.
Figure 16:
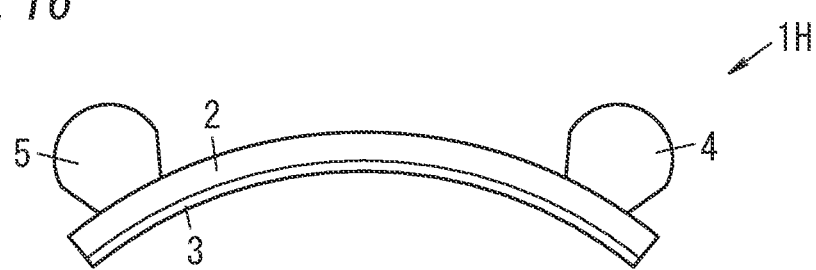
FIG. 16 is a front view of a proximity sensor of an eighth variation.
Figure 17:
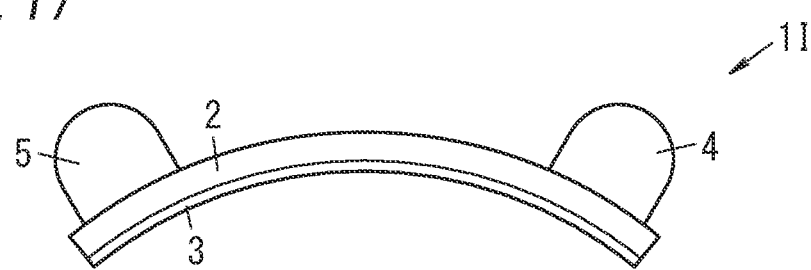
FIG. 17 is a front view of a proximity sensor of a ninth variation.

With reference to FIGS. 15 to 17, proximity sensors 1G to 1I respectively according to seventh to ninth variations of the embodiment will be described below. In the proximity sensors 1G to 1I, each of a base 2 and a conductor 3 has an arc shape in the cross section orthogonal to the X-axis direction (first direction).

The proximity sensor 1G includes the transmission electrode 5 and the receiving electrode 4 of FIG. 12 which are arranged in a proximity sensor including the base 2 and the conductor 3 each having the arc shape.

The proximity sensor 1H includes the transmission electrode 5 and the receiving electrode 4 of FIG. 13 which are arranged in a proximity sensor including the base 2 and the conductor 3 each having the arc shape.

The proximity sensor 1I includes the transmission electrode 5 and the receiving electrode 4 of FIG. 14 which are arranged in a proximity sensor including the base 2 and the conductor 3 each having the arc shape.

(12) Tenth Variation

Figure 18:
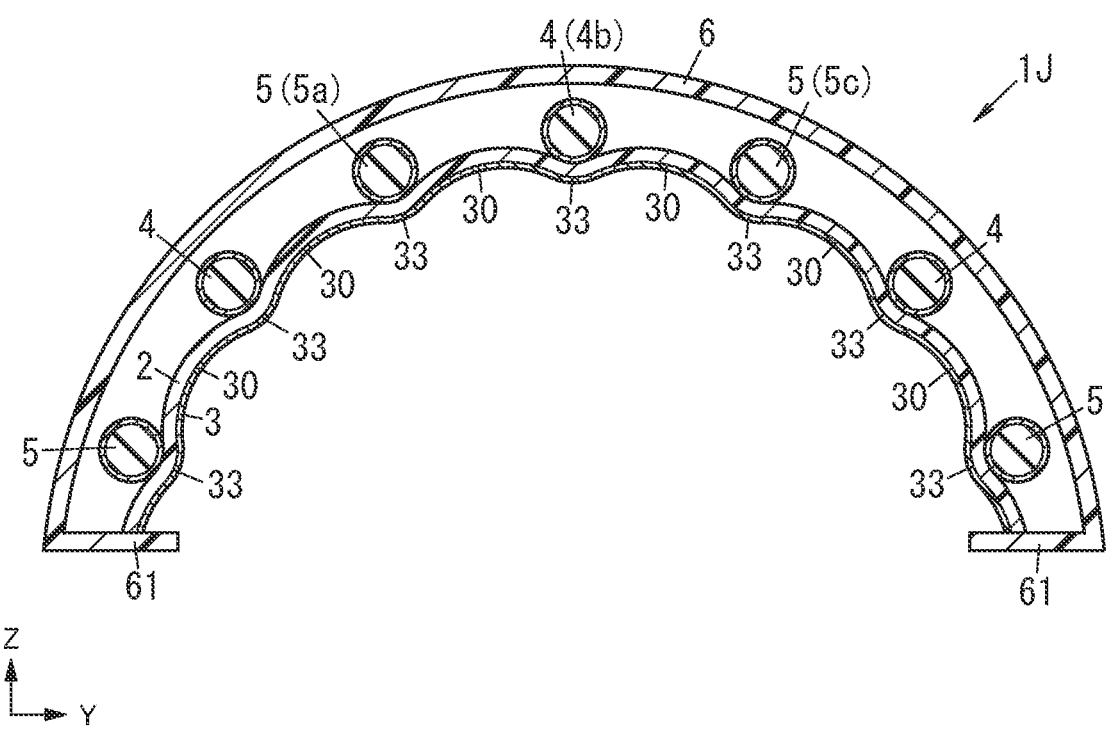
FIG. 18 is a front view of a proximity sensor of a tenth variation.

Next, with reference to FIG. 18, a proximity sensor 1J according to a tenth variation will be described.

The proximity sensor 1J includes a plurality of (in FIG. 18, four) transmission electrodes 5 and a plurality of (in FIG. 18, three) receiving electrodes 4. In the cross section orthogonal to the X-axis direction (first direction), the plurality of transmission electrodes 5 and the plurality of receiving electrodes 4 are aligned in the shape of a circular arc.

A conductor 3 includes a plurality of (in FIG. 18, six) convex regions 30. In the cross section orthogonal to the X-axis direction (first direction), each of the plurality of convex regions 30 has a circular arc shape. The plurality of convex regions 30 are aligned in the shape of a circular arc. Moreover, the conductor 3 has a concave region 33 between two adjacent convex regions 30. That is, the conductor 3 includes a plurality of (in FIG. 18, seven) concave regions 33. In a region on an opposite side of a base 2 from each concave region 33, a corresponding one of the transmission electrodes 5 or the receiving electrodes 4 is disposed. Thus, along the conductor 3, the transmission electrodes 5 and the receiving electrodes 4 are alternately aligned.

A specific receiving electrode 4 of the plurality of receiving electrodes 4, is referred to as a receiving electrode 4b. Moreover, of the plurality of transmission electrodes 5, two transmission electrodes 5 adjacent to the receiving electrode 4b are referred to as transmission electrodes 5a and 5c. When a direction in which the transmission electrode 5a and the receiving electrode 4b are aligned with each other is defined as the second direction (Y-axis direction), at least the transmission electrode 5a, the receiving electrode 4b, and the transmission electrode 5c are aligned along the second direction. Moreover, at least the transmission electrode 5a, the receiving electrode 4b, and the transmission electrode 5c are disposed above (in the positive direction of the Z axis) the corresponding concave regions 33.

The proximity sensor 1J further includes a cover 6. The cover 6 is electrically insulating. The cover 6 holds the base 2 and the conductor 3. The cover 6 has a semicircular arc shape in the cross section orthogonal to the X-axis direction (first direction). The cover 6 has both ends, in the cross section, each having a pawl 61 extending toward the inner side of the cover 6. That is, the cover 6 includes two pawls 61. The two pawls 61 hold the base 2 and the conductor 3. The cover 6 extends in the X-axis direction.

The plurality of transmission electrodes 5 and the plurality of receiving electrodes 4 are disposed between the base 2 and the cover 6. Thus, the plurality of transmission electrodes 5 and the plurality of receiving electrodes 4 are not exposed outside.

In the proximity sensor 1J having such a configuration, movement of a sensing target located radially outside the cover 6 changes an electrostatic capacitance between each transmission electrode 5 and its adjacent receiving electrode 4, and therefore, the proximity sensor 1J can sense the sensing target.

In the cross section orthogonal to the X-axis direction (first direction), the shape of the cover 6 is not limited to the semicircular arc shape but may be a circular arc shape longer than or shorter than the semicircular arc or may be a circularly annular shape, for example.

Note that also in a configuration as the embodiment in which the transmission electrodes 5 and the receiving electrode 4 are aligned in the Y-axis direction (see FIG. 2), a plurality of transmission electrodes 5 and a plurality of receiving electrodes 4 may be alternately aligned.

(13) Other Variations

Other variations of the embodiment will be described below. The following variations may be embodied accordingly in combination. Moreover, the following variations may be embodied accordingly in combination with each of the variations described above.

The equipment 10 is not limited to the robot arm. The equipment 10 may be, for example, another robot, a radio control device, a lighting fixture, a personal computer, a display, audio equipment, or a household appliance. Moreover, the proximity sensor 1 may be a component of an operation device configured to receive an operation, given by a user, for controlling operation of the functional unit 9 of the equipment 10. In this case, that a user brings his/her hand, body, or the like close to the operation device or moves in a prescribed manner corresponds to the operation, and the proximity sensor 1 senses the operation, in response to which, the functional unit 9 performs prescribed operation.

In the equipment 10, a plurality of proximity sensors 1 may be installed. For example, the plurality of proximity sensors 1 are installed to be aligned in a row with prescribed spaces provided therebetween, and synchronized driving of (application of a drive voltage to) the plurality of proximity sensors 1 can also detect a sensing target moving in a direction in which the plurality of proximity sensors 1 are aligned in a row. In accordance with this detection situation, prescribed control can also be performed at the side of the equipment 10. For example, when the equipment 10 is equipped with a display, control such as moving a selection location within a screen of the display or scrolling the screen in accordance with the detection situation of the plurality of proximity sensors 1 may be performed.

Collecting the control system 8 and the functional unit 9 in one device (equipment 10) is not essential, but a device including the control system 8 and a device including the functional unit 9 may be separately provided.

The first core member 511, the second core member 41, and the third core member 521 for the receiving electrode 4 and the plurality of transmission electrodes 5 may be electrically conductive. The first core member 511, the second core member 41, and the third core member 521 may be made of an electrically conductive material. The first core member 511, the second core member 41, and the third core member 521 may be made of metal (e.g., copper and the like).

The first core member 511 and the first conductive layer 512 which are electrically conductive may be made of different material or the same material. For example, when the first transmission electrode 51 is made from an electrically conductive columnar bar-like member, the first conductive layer 512 may be omitted. Detailed description will be omitted, but the same configuration applies to the second core member 41 and the third core member 521.

The number of transmission electrodes 5 is not limited to two, but one transmission electrode 5 or three or more transmission electrodes 5 may be provided. The number of receiving electrodes 4 is not limited to one, but two or more receiving electrodes 4 may be provided. For example, the proximity sensor 1 may include two receiving electrodes 4 and one transmission electrode 5 disposed between the two receiving electrodes 4.

SUMMARY

From the embodiment and the like described above, the following aspects are disclosed.

A proximity sensor (1, 1A to 1J) of a first aspect is a mutual capacitance proximity sensor. The proximity sensor (1, 1A to 1J) includes a conductor (3), a receiving electrode (4), and a first transmission electrode (51). The conductor (3) has an upper surface (3U). The receiving electrode (4) is separate from the upper surface (3U) of the conductor (3) in an upward direction and extends along a first direction. The first direction is orthogonal to the upward direction. The first transmission electrode (51) is separate from the upper surface (3U) of the conductor (3) in the upward direction and extends along the first direction. The first transmission electrode (51) and the receiving electrode (4) are aligned with each other in a second direction. The second direction is orthogonal to both the upward direction and the first direction. The first transmission electrode (51) has an upper surface (51U) having a shape bulging in the upward direction in a cross section orthogonal to the first direction.

In this configuration, the area of the upper surface (51U) of the first transmission electrode (51) is larger than in the case where the upper surface (51U) of the first transmission electrode (51) is a flat surface. This increases a change amount in an electrostatic capacitance between the first transmission electrode (51) and the receiving electrode (4) when a sensing target approaches the proximity sensor (1, 1A to 1J), thereby improving detection sensitivity to the sensing target.

In a proximity sensor (1, 1A to 1J) of a second aspect referring to the first aspect, in the cross section orthogonal to the first direction, the upper surface (51U) of the first transmission electrode (51) has a circular arc shape.

With this configuration, the upper surface (51U) of the first transmission electrode (51) has an increased area.

In a proximity sensor (1, 1A to 1C, 1J) of a third aspect referring to the second aspect, in the cross section orthogonal to the first direction, the first transmission electrode (51) has a circular shape.

This configuration makes the first transmission electrode (51) less directional.

In a proximity sensor (1, 1B to 1C, 1G to 1J) of a fourth aspect referring to any one of the first to third aspects, the upper surface (3U) of the conductor (3) includes a convex region (30). The convex region (30) has a shape extending along the first direction and bulging in the upward direction. The convex region (30) has an upper end (310) located between the first transmission electrode (51) and the receiving electrode (4) when viewed from above.

In this configuration, detection sensitivity to the sensing target is improved as compared with a configuration including no convex region (30).

In a proximity sensor (1, 1B to 1C, 1G to 1J) of a fifth aspect referring to the fourth aspect, in the cross section orthogonal to the first direction, the convex region (30) has a circular arc shape.

With this configuration, the detection sensitivity to the sensing target is further improved.

In a proximity sensor (1, 1B to 1C, 1G to 1J) of a sixth aspect referring to the fifth aspect, in the cross section orthogonal to the first direction, the convex region (30) has a radius of curvature (R1) ¼ or more times and 4 or less times a width (W1) of the first transmission electrode (51) in the second direction.

With this configuration, the detection sensitivity to the sensing target is further improved.

In a proximity sensor (1, 1B to 1C, 1G to 1J) of a seventh aspect referring to the fifth or sixth aspect, in the cross section orthogonal to the first direction, an angle (θ1) formed between a first line segment (J1) connecting a center of curvature (Q1) of the convex region (30) to the receiving electrode (4) and a second line segment (J2) connecting the center of curvature (Q1) of the convex region (30) to the first transmission electrode (51) is greater than or equal to 60 degrees and less than or equal to 180 degrees.

With this configuration, the detection sensitivity to the sensing target is further improved.

In a proximity sensor (1, 1A to 1J) of an eighth aspect referring to any one of the first to seventh aspects, a ratio of an area of a surface, extending in the first direction, of the first transmission electrode (51) to an area of a surface, extending in the first direction, of the receiving electrode (4) is set in accordance with sensitivity.

With this configuration, desired sensitivity is obtained as the sensitivity of the proximity sensor (1, 1A to 1J).

A proximity sensor (1, 1J) of a ninth aspect referring to any one of the first to eighth aspects further includes a second transmission electrode (52). The second transmission electrode (52) is separate from the upper surface (3U) of the conductor (3) in the upward direction and extends along the first direction. The first transmission electrode (51) is disposed on a side, with respect to the receiving electrode (4), in one direction of both directions parallel to the second direction. The second transmission electrode (52) is disposed on a side, with respect to the receiving electrode (4), in the other direction of both the directions parallel to the second direction.

With this configuration, a sensing target in a larger space range is sensed as compared with a configuration including no second transmission electrode (52).

In a proximity sensor (1, 1J) of a tenth aspect referring to the ninth aspect, the second transmission electrode (52) has an upper surface (52U) having a shape bulging in the upward direction in the cross section orthogonal to the first direction.

With this configuration, the area of the upper surface (52U) of the second transmission electrode (52) is larger than in the case where the upper surface (52U) of the second transmission electrode (52) is a flat surface. This increases change amount in an electrostatic capacitance between the second transmission electrode (52) and the receiving electrode (4) when a sensing target approaches the proximity sensor (1J), thereby improving detection sensitivity to the sensing target.

In a proximity sensor (1, 1J) of an eleventh aspect referring to the tenth aspect, in the cross section orthogonal to the first direction, the second transmission electrode (52) has a circular shape.

This configuration makes the second transmission electrode (52) less directional.

In a proximity sensor (1, 1J) according to a twelfth aspect referring to any one of the ninth to eleventh aspects, the upper surface (3U) of the conductor (3) includes a first convex region (31), a second convex region (32), and a concave region (33). The first convex region (31) has a shape extending in the first direction and bulging in the upward direction. The second convex region (32) has a shape extending along the first direction and bulging in the upward direction. The concave region (33) is provided at a location which is between an upper end (310) of the first convex region (31) and an upper end (320) of the second convex region (32) in the second direction and which is under the receiving electrode (4). The concave region (33) has a shape extending along the first direction and recessed in a downward direction. The upper end (310) of the first convex region (31) is located between the first transmission electrode (51) and the receiving electrode (4) when viewed from above. The upper end (320) of the second convex region (32) is located between the second transmission electrode (52) and the receiving electrode (4) when viewed from above.

With this configuration, the detection sensitivity to the sensing target is improved as compared with a configuration including neither the first convex region (31) nor the second convex region (32).

In a proximity sensor (1, 1J) of a thirteenth aspect referring to the twelfth aspect, in the cross section orthogonal to the first direction, each of the first convex region (31) and the second convex region (32) has a circular arc shape.

With this configuration, the detection sensitivity to the sensing target is further improved.

In a proximity sensor (1, 1J) of a fourteenth aspect referring to any one of the ninth to thirteenth aspects, a ratio of an area of a surface, extending along the first direction, of the second transmission electrode (52) to an area of a surface, extending in the first direction, of the receiving electrode (4) is set in accordance with sensitivity.

With this configuration, desired sensitivity is obtained as the sensitivity of the proximity sensor (1, 1J).

In a proximity sensor (1, 1A to 1J) of a fifteenth aspect referring to any one of the first to fourteenth aspects, the conductor (3) is connected to a ground.

With this configuration, the conductor (3) as an electrostatic shield is grounded, thereby improving a noise resistance performance of the proximity sensor (1, 1A to 1J).

In a proximity sensor (1, 1A to 1J) of a sixteenth aspect referring to any one of the first to fifteenth aspects, the first transmission electrode (51) includes a first core member (511) which is electrically insulating and a first conductive layer (512) covering the first core member (511). The receiving electrode (4) includes a second core member (41) which is electrically insulating and a second conductive layer (42) covering the second core member (41).

With this configuration, the configuration of each of the first transmission electrode (51) and the receiving electrode (4) is simplified.

A proximity sensor (1, 1A to 1J) of a seventeenth aspect referring to any one of the first to sixteenth aspect further includes a base (2) which is electrically insulating. The base (2) has a lower surface (2L) in contact with the upper surface (3U) of the conductor (3) and an upper surface (2U) on which the first transmission electrode (51) and the receiving electrode (4) are arranged.

With this configuration, the base (2) is between the conductor (3) and each of the first transmission electrode (51) and the receiving electrode (4), and therefore, a distance is secured between the conductor (3) and each of the first transmission electrode (51) and the receiving electrode (4).

In a proximity sensor (1, 1J) of an eighteenth aspect is a mutual capacitance proximity sensor. The proximity sensor (1, 1J) includes a conductor (3), a receiving electrode (4), a first transmission electrode (51), and a second transmission electrode (52). The conductor (3) has an upper surface (3U). The receiving electrode (4) is separate from the upper surface (3U) of the conductor (3) in an upward direction and extends along a first direction. The first direction is orthogonal to the upward direction. The first transmission electrode (51) is separate from the upper surface (3U) of the conductor (3) in the upward direction and extends along the first direction. The second transmission electrode (52) is separate from the upper surface (3U) of the conductor (3) in the upward direction and extends along the first direction. The first transmission electrode (51) is disposed on a side, with respect to the receiving electrode (4), in one direction of both directions parallel to the second direction. The second direction is orthogonal to both the upward direction and the first direction. The second transmission electrode (52) is disposed on a side, with respect to the receiving electrode (4), in the other direction of both the directions parallel to the second direction. The upper surface (3U) of the conductor (3) includes a first convex region (31), a second convex region (32), and a concave region (33). The first convex region (31) has a shape extending in the first direction and bulging in the upward direction. The second convex region (32) has a shape extending along the first direction and bulging in the upward direction. The concave region (33) is provided at a location which is between an upper end (310) of the first convex region (31) and an upper end (320) of the second convex region (32) in the second direction and which is under the receiving electrode (4). The concave region (33) has a shape extending along the first direction and bulging in a downward direction. The upper end (310) of the first convex region (31) is located between the first transmission electrode (51) and the receiving electrode (4) when viewed from above. The upper end (320) of the second convex region (32) is located between the second transmission electrode (52) and the receiving electrode (4) when viewed from above. The first transmission electrode (51) has an upper surface (51U) having a shape bulging in the upward direction in a cross section orthogonal to the first direction. The second transmission electrode (52) has an upper surface (52U) having a shape bulging in the upward direction in the cross section orthogonal to the first direction.

With this configuration, the area of each of the upper surface (51U) of the first transmission electrode (51) and the upper surface (52U) of the second transmission electrode (52) is larger than in the case where the upper surfaces (51U, 52U) are flat surfaces. This increases a change amount in an electrostatic capacitance between the receiving electrode (4) and each of the first transmission electrode (51) and the second transmission electrode (52) when a sensing target approaches the proximity sensor (1, 1J), thereby improving detection sensitivity to the sensing target.

In a proximity sensor (1, 1J) of a nineteenth aspect referring to the eighteenth aspect, in the cross section orthogonal to the first direction, each of the first convex region (31) and the second convex region (32) has a circular arc shape.

With this configuration, the detection sensitivity to the sensing target is further improved.

In a proximity sensor (1, 1J) according to a twentieth aspect referring to the nineteenth aspect, in the cross section orthogonal to the first direction, an angle (θ1) formed between a first line segment (J1) connecting a center of curvature (Q1) of the first convex region (31) to the receiving electrode (4) and a second line segment (J2) connecting the center of curvature (Q1) of the first convex region (31) to the first transmission electrode (51) is greater than or equal to 60 degrees and less than or equal to 180 degrees.

With this configuration, the detection sensitivity to the sensing target is further improved.

In a proximity sensor (1, 1J) of a twenty-first aspect referring to the nineteenth or twentieth aspect, in the cross section orthogonal to the first direction, an angle (θ2) formed between a line segment (J3) connecting a center of curvature (Q2) of the second convex region (32) to the receiving electrode (4) and a line segment (J4) connecting the center of curvature (Q2) of the second convex region (32) to the second transmission electrode (52) is greater than or equal to 60 degrees and less than or equal to 180 degrees.

With this configuration, the detection sensitivity to the sensing target is further improved.

In a proximity sensor (1, 1J) of a twenty-second aspect referring to any one of the eighteenth to twenty-first aspects, a ratio of an area of a surface, extending in the first direction, of the first transmission electrode (51) to an area of a surface, extending in the first direction, of the receiving electrode (4) is set in accordance with sensitivity.

With this configuration, desired sensitivity is obtained as the sensitivity of the proximity sensor (1, 1J).

In a proximity sensor (1, 1J) of a twenty-third aspect referring to any one of the eighteenth to twenty-second aspects, the conductor (3) is connected to a ground.

With this configuration, the conductor (3) as an electrostatic shield is grounded, thereby improving a noise resistance performance of the proximity sensor (1, 1J).

In a proximity sensor (1, 1J) of a twenty-fourth aspect referring to any one of the eighteenth to twenty-third aspects, the first transmission electrode (51) includes a first core member (511) which is electrically insulating and a first conductive layer (512) covering the first core member (511). The receiving electrode (4) includes a second core member (41) which is electrically insulating and a second conductive layer (42) covering the second core member (41). The second transmission electrode (52) includes a third core member (521) which is electrically insulating and a third conductive layer (522) covering the third core member (521).

With this configuration, the configuration of each of the first transmission electrode (51), the second transmission electrode (52), and the receiving electrode (4) is simplified.

A proximity sensor (1, 1J) of a twenty-fifth aspect referring to any one of the eighteenth to twenty-fourth aspects further includes a base (2) which is electrically insulating. The base (2) has a lower surface (2L) in contact with the upper surface (3U) of the conductor (3) and an upper surface (2U) on which the first transmission electrode (51), the second transmission electrode (52), and the receiving electrode (4) are arranged.

With this configuration, the base (2) is sandwiched between the conductor (3) and each of the first transmission electrode (51), the second transmission electrode (52), and the receiving electrode (4), thereby securing a distance between the conductor (3) and each of the first transmission electrode (51), the second transmission electrode (52), and the receiving electrode (4).

Configurations other than the first aspect are not essential configurations for the proximity sensor (1, 1A to 1J) and may thus accordingly be omitted.

A control system of twenty-sixth aspect includes: the proximity sensor (1, 1A to 1J) of any one of the first to twenty-fifth aspects; and an output section (821). The output section (821) is configured to output a control signal which controls equipment (10) in accordance with an output from the proximity sensor (1, 1A to 1J).

With this configuration, the proximity sensor (1, 1A to 1J) has relatively high detection sensitivity, thereby improving the accuracy of control performed on the equipment (10) in accordance with the sensing result by the proximity sensor (1, 1A to 1J).

Equipment (10) according to a twenty-seventh aspect includes: the proximity sensor (1, 1A to 1J) of any one of the first to twenty-fifth aspects; and a functional unit (9). The functional unit (9) is configured to operate in accordance with an output from the proximity sensor (1, 1A to 1J).

With this configuration, the proximity sensor (1, 1A to 1J) has relatively high detection sensitivity, thereby improving the accuracy of control performed on the functional unit (9) in accordance with a signal output from the proximity sensor (1, 1A to 1J).

REFERENCE SIGNS LIST 1, 1A to 1J Proximity Sensor
2 Base
2L Lower Surface
2U Upper Surface
3 Conductor
3U Upper Surface
4 Receiving electrode
9 Functional Unit
10 Equipment
30 Convex Region
31 First Convex Region
32 Second Convex Region
33 Concave Region
41 Second Core Member
42 Second Conductive Layer
51 First Transmission Electrode
51U Upper Surface
52 Second Transmission Electrode
52U Upper Surface
310, 320 Upper End
511 First Core Member
512 First Conductive Layer
521 Third Core Member
522 Third Conductive Layer
821 Output Section
J1 First Line Segment
J2 Second Line Segment
J3, J4 Line Segment
Q1, Q2 Center Of Curvature
R1, R2 Radius Of Curvature
W1 Width
θ1, θ2 Angle

The invention claimed is:

1. A proximity sensor which is a mutual capacitance proximity sensor comprising:
   a conductor having an upper surface;
   a receiving electrode separate from the upper surface of the conductor in an upward direction and extending along a first direction orthogonal to the upward direction; and
   a first transmission electrode separate from the upper surface of the conductor in the upward direction and extending along the first direction, the first transmission electrode and the receiving electrode being aligned with each other in a second direction orthogonal to both the upward direction and the first direction,
the first transmission electrode having an upper surface having a shape bulging in the upward direction in a cross section orthogonal to the first direction.

2. The proximity sensor of claim 1, wherein
in the cross section orthogonal to the first direction, the upper surface of the first transmission electrode has a circular arc shape.

3. The proximity sensor of claim 2, wherein
in the cross section orthogonal to the first direction, the first transmission electrode has a circular shape.

4. The proximity sensor of claim 1, wherein
the upper surface of the conductor includes a convex region having a shape extending along the first direction and bulging in the upward direction, and
the convex region has an upper end located between the first transmission electrode and the receiving electrode when viewed from above.

5. The proximity sensor of claim 4, wherein
in the cross section orthogonal to the first direction, the convex region has a circular arc shape.

6. The proximity sensor of claim 5, wherein
in the cross section orthogonal to the first direction, the convex region has a radius of curvature ¼ or more times and 4 or less times a width of the first transmission electrode in the second direction.

7. The proximity sensor of claim 5, wherein
in the cross section orthogonal to the first direction, an angle formed between a first line segment connecting a center of curvature of the convex region to the receiving electrode and a second line segment connecting the center of curvature of the convex region to the first transmission electrode is greater than or equal to 60 degrees and less than or equal to 180 degrees.

8. The proximity sensor of claim 1, wherein
a ratio of an area of a surface, extending in the first direction, of the first transmission electrode to an area of a surface, extending in the first direction, of the receiving electrode is set in accordance with sensitivity.

9. The proximity sensor of claim 1, further comprising
a second transmission electrode separate from the upper surface of the conductor in the upward direction and extending along the first direction, wherein
the first transmission electrode is disposed on a side, with respect to the receiving electrode, in one direction of both directions parallel to the second direction, and
the second transmission electrode is disposed on a side, with respect to the receiving electrode, in the other direction of both the directions parallel to the second direction.

10. The proximity sensor of claim 9, wherein
in the cross section orthogonal to the first direction, the second transmission electrode has an upper surface having a shape bulging in the upward direction.

11. The proximity sensor of claim 10, wherein
in the cross section orthogonal to the first direction, the second transmission electrode has a circular shape.

12. The proximity sensor of claim 9, wherein
the upper surface of the conductor includes
a first convex region having a shape extending along the first direction and bulging in the upward direction,
a second convex region having a shape extending along the first direction and bulging in the upward direction, and
a concave region provided at a location which is between an upper end of the first convex region and an upper end of the second convex region in the second direction and which is under the receiving electrode, the concave region having a shape extending in the first direction and recessed in a downward direction,
the upper end of the first convex region is located between the first transmission electrode and the receiving electrode when viewed from above, and
the upper end of the second convex region is located between the second transmission electrode and the receiving electrode when viewed from above.

13. The proximity sensor of claim 12, wherein
in the cross section orthogonal to the first direction, each of the first convex region and the second convex region has a circular arc shape.

14. The proximity sensor of claim 9, wherein
a ratio of an area of a surface, extending along the first direction, of the second transmission electrode to an area of a surface, extending in the first direction, of the receiving electrode is set in accordance with sensitivity.

15. The proximity sensor of claim 1, wherein
the conductor is connected to a ground.

16. The proximity sensor of claim 1, wherein
the first transmission electrode includes p2 a first core member which is electrically insulating and
a first conductive layer covering the first core member, and
the receiving electrode includes
a second core member which is electrically insulating and
a second conductive layer covering the second core member.

17. The proximity sensor of claim 1, further comprising a base which is electrically insulating, wherein
the base has
a lower surface in contact with the upper surface of the conductor and
an upper surface on which the first transmission electrode and the receiving electrode are arranged.

18. A control system comprising:
the proximity sensor of claim 1; and
an output section configured to output a control signal which controls equipment in accordance with an output from the proximity sensor.

19. Equipment comprising:
the proximity sensor of claim 1; and
a functional unit configured to operate in accordance with an output from the proximity sensor.

20. A proximity sensor which is a mutual capacitance proximity sensor comprising:
a conductor having an upper surface;
a receiving electrode separate from the upper surface of the conductor in an upward direction and extending along a first direction orthogonal to the upward direction;
a first transmission electrode separate from the upper surface of the conductor in the upward direction and extends along the first direction; and
a second transmission electrode separate from the upper surface of the conductor in the upward direction and extends along the first direction, the first transmission electrode being disposed on a side, with respect to the receiving electrode, in one direction of both directions parallel to a second direction orthogonal to both the upward direction and the first direction, the second transmission electrode being disposed on a side, with respect to the receiving electrode, in the other direction of both the directions parallel to the second direction, the upper surface of the conductor including
- a first convex region having a shape extending along the first direction and bulging in the upward direction,
- a second convex region having a shape extending along the first direction and bulging in the upward direction, and
- a concave region being provided at a location which is between an upper end of the first convex region and an upper end of the second convex region in the second direction and which is under the receiving electrode, the concave region having a shape extending in the first direction and bulging in a downward direction, the upper end of the first convex region being located between the first transmission electrode and the receiving electrode when viewed from above, the upper end of the second convex region being located between the second transmission electrode and the receiving electrode when viewed from above, the first transmission electrode having an upper surface having a shape bulging in the upward direction in a cross section orthogonal to the first direction, the second transmission electrode having an upper surface having a shape bulging in the upward direction in the cross section orthogonal to the first direction.

* * * * *